United States Patent
Iizuka et al.

(10) Patent No.: US 10,658,469 B2
(45) Date of Patent: May 19, 2020

(54) SEMICONDUCTOR DEVICE INCLUDING A PLURALITY OF NITRIDE SEMICONDUCTOR LAYERS

(71) Applicant: Renesas Electronics Corporation, Tokyo (JP)

(72) Inventors: Toshihiro Iizuka, Tokyo (JP); Shin Koyama, Tokyo (JP); Yoshitake Kato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/306,445

(22) PCT Filed: May 1, 2014

(86) PCT No.: PCT/JP2014/062095
§ 371 (c)(1),
(2) Date: Oct. 24, 2016

(87) PCT Pub. No.: WO2015/166572
PCT Pub. Date: Nov. 5, 2015

(65) Prior Publication Data
US 2017/0047409 A1 Feb. 16, 2017

(51) Int. Cl.
*H01L 29/20* (2006.01)
*H01L 29/778* (2006.01)
(Continued)

(52) U.S. Cl.
CPC ...... *H01L 29/2003* (2013.01); *H01L 21/0228* (2013.01); *H01L 21/02178* (2013.01);
(Continued)

(58) Field of Classification Search
CPC ........... H01L 29/2003; H01L 21/02178; H01L 21/0228
See application file for complete search history.

(56) References Cited

U.S. PATENT DOCUMENTS

2006/0289948 A1  12/2006 Brown et al.
2007/0272967 A1  11/2007 Pantisano et al.
(Continued)

FOREIGN PATENT DOCUMENTS

JP  2007-324593 A  12/2007
JP  2009-117557 A  5/2009
(Continued)

OTHER PUBLICATIONS

International Search Report (ISR) (PCT Form PCT/ISA/210), in PCT/JP2014/062095, dated Aug. 5, 2014.
(Continued)

*Primary Examiner* — Lex H Malsawma
*Assistant Examiner* — Xia L Cross
(74) *Attorney, Agent, or Firm* — McGinn IP Law Group, PLLC

(57) ABSTRACT

In a semiconductor device (MISFET) having a gate electrode formed over a nitride semiconductor layer with a gate insulating film interposed therebetween, the gate insulating film includes a first gate insulating film (oxide film of first metal) formed on the nitride semiconductor layer and a second gate insulating film (oxide film of second metal). The second metal (for example, Hf) has electronegativity lower than that of the first metal (for example, Al). Since the electronegativity of the second metal is lower than that of the first metal, negative charge is introduced into the oxide film of the first metal due to interfacial polarization, so that the flat-band voltage can be shifted in a positive direction. Accordingly, the threshold voltage which has become negative due to the heat treatment of the oxide film of the first metal can be shifted in the positive direction.

10 Claims, 12 Drawing Sheets

(51) Int. Cl.
*H01L 29/78* (2006.01)
*H01L 21/02* (2006.01)
*H01L 29/205* (2006.01)
*H01L 29/423* (2006.01)
*H01L 29/51* (2006.01)
*H01L 29/66* (2006.01)

(52) U.S. Cl.
CPC ...... *H01L 29/205* (2013.01); *H01L 29/42364* (2013.01); *H01L 29/513* (2013.01); *H01L 29/517* (2013.01); *H01L 29/66462* (2013.01); *H01L 29/66522* (2013.01); *H01L 29/778* (2013.01); *H01L 29/7786* (2013.01); *H01L 29/78* (2013.01); *H01L 29/4236* (2013.01); *H01L 29/4238* (2013.01)

(56) References Cited

U.S. PATENT DOCUMENTS

| | | | |
|---|---|---|---|
| 2009/0114995 A1 | 5/2009 | Suzuki et al. | |
| 2009/0242881 A1* | 10/2009 | Yoon | H01L 27/1225 257/43 |
| 2010/0025730 A1* | 2/2010 | Heikman | H01L 29/7787 257/194 |
| 2010/0059656 A1 | 3/2010 | Sum | |
| 2010/0159656 A1 | 6/2010 | Nakata et al. | |
| 2011/0081775 A1 | 4/2011 | Pierreux et al. | |
| 2011/0124169 A1* | 5/2011 | Ye | C23C 16/325 438/299 |
| 2011/0291160 A1* | 12/2011 | Ota | H01L 29/1029 257/194 |
| 2012/0280244 A1* | 11/2012 | Hwang | H01L 29/66462 257/76 |
| 2012/0319165 A1* | 12/2012 | Nakayama | H01L 29/4236 257/190 |
| 2013/0009111 A1* | 1/2013 | Morita | H01L 21/02554 252/519.1 |
| 2013/0146862 A1* | 6/2013 | Kim | H01L 29/7869 257/43 |
| 2013/0242618 A1* | 9/2013 | Yamada | H01L 29/66431 363/17 |

FOREIGN PATENT DOCUMENTS

| | | |
|---|---|---|
| JP | 2010-166040 A | 7/2010 |
| JP | 2011-103459 A | 5/2011 |
| JP | 2013-004735 A | 1/2013 |
| JP | 2013-168433 A | 8/2013 |

OTHER PUBLICATIONS

Ota, K., et al. "A Normally-off GaN FET with High Threshold Voltage Uniformity Using a Novel Piezo Neutralization Technique". IEDM 2009, p. 153-156.

Taiwanese Office Action dated Nov. 27, 2018, in corresponding Taiwanese Patent Application No. 104113590, with an English translation thereof.

Chinese Office Action dated Apr. 25, 2919, in corresponding Chinese Application No. 201480078152.1, with an English translation thereof.

Chinese Office Action dated Nov. 16, 2018 in corresponding Chinese Application No. 201480078152.1, with an English translation thereof.

* cited by examiner

SEMICONDUCTOR DEVICE INCLUDING A PLURALITY OF NITRIDE SEMICONDUCTOR LAYERS

TECHNICAL FIELD

The present invention relates to a semiconductor device and a manufacturing method of a semiconductor device and can be effectively applied to, for example, a semiconductor device using nitride semiconductor and a manufacturing method thereof.

BACKGROUND ART

In recent years, semiconductor devices using III-V group compound with a bandgap larger than that of Si have attracted attention. Among them, a semiconductor device using nitride semiconductor such as gallium nitride (GaN) has characteristics of being able to operate at high speed and with low loss. In addition, a power MISFET (Metal Insulator Field Effect Transistor) using GaN-based nitride semiconductor can achieve the normally-off operation and the development thereof has been advancing.

For example, the Non-Patent Document 1 listed below discloses a GaN FET having a gate insulating film made of $Al_2O_3$.

RELATED ART DOCUMENTS

Non-Patent Documents

Non-Patent Document 1: IEDM 2009, p. 153-156 A Normally-off GaN FET with High Threshold Voltage Uniformity Using A Novel Piezo Neutralization Technique

SUMMARY OF THE INVENTION

Problems to be Solved by the Invention

The inventors of the present invention have been engaged in research and development of a semiconductor device using nitride semiconductor like that mentioned above, and have conducted intensive studies regarding the improvement of characteristics of a normally-off semiconductor device. During the course of the studies, it has been found out that there is still room for improvement in terms of a semiconductor device using nitride semiconductor and a manufacturing method of the semiconductor device.

The other problems and novel characteristics will be apparent from the description of the present specification and the accompanying drawings.

Means for Solving the Problems

The following is a brief description of an outline of the representative embodiments disclosed in the present application.

A semiconductor device described in an embodiment disclosed in this application includes: a gate electrode formed over a nitride semiconductor layer with a gate insulating film interposed therebetween, and the gate insulating film includes an oxide film of first metal formed on the nitride semiconductor layer and an oxide film of second metal formed on the oxide film of the first metal. Also, the first metal is different from an element constituting the nitride semiconductor layer, and the second metal has electronegativity lower than that of the first metal.

A manufacturing method of a semiconductor device described in an embodiment disclosed in this application includes the steps of: depositing an oxide film of first metal on a nitride semiconductor layer; forming an oxide film of second metal on the oxide film of the first metal; and forming a gate electrode on the oxide film of the second metal. The method further includes the step of performing a heat treatment to the oxide film of the second metal. Also, the second metal has electronegativity lower than that of the first metal.

Effects of the Invention

According to a semiconductor device to be shown in the representative embodiments disclosed below in this application, it is possible to improve the characteristics of the semiconductor device.

According to a manufacturing method of a semiconductor device to be shown in the representative embodiments disclosed below in this application, it is possible to manufacture a semiconductor device with good characteristics.

BRIEF DESCRIPTIONS OF THE DRAWINGS

DETAILED DESCRIPTION OF PREFERRED EMBODIMENTS

Figure 1:
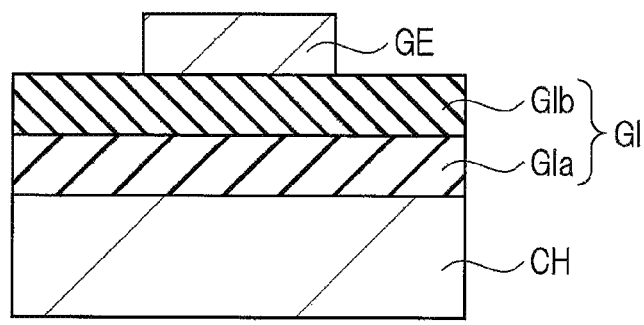
FIG. 1 is a cross-sectional view showing a configuration of a semiconductor device of a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the constituent elements (including element steps) are not always indispensable unless otherwise stated or except the case where the constituent elements are apparently indispensable in principle. Similarly, in the embodiments described below, when the shape of the constituent elements, positional relation thereof and the like are mentioned, the substantially approximate and similar shapes and the like are included therein unless otherwise stated or except the case where it is conceivable that they are apparently excluded in principle. The same goes for the numbers (including the number of pieces, numerical value, amount, range and others) described above.

Hereinafter, embodiments will be described in detail based on the drawings. Note that the members having the same function are denoted by the same reference characters throughout the drawings for describing the embodiments, and the repetitive description thereof will be omitted. Also, when there are a plurality of similar members (portions), an individual or specific portion is indicated by adding a symbol to a generic character in some cases. In addition, the description of the same or similar portions is not repeated in principle unless particularly required in the following embodiments.

Further, in the drawings used in the following embodiments, hatching is omitted in some cases even in a cross-sectional view so as to make the drawing easy to see. Also, hatching is used in some cases even in a plan view so as to make the drawing easy to see.

Further, the size of respective portions does not correspond to that of an actual device in a cross-sectional view and a plan view, and a specific portion is shown in a relatively enlarged manner in some cases so as to make the drawing easy to see. Also, even when a cross-sectional view and a plan view correspond to each other, a specific portion is shown in a relatively enlarged manner in some cases so as to make the drawing easy to see.

First Embodiment

Hereinafter, a semiconductor device of the present embodiment will be described in detail with reference to drawings.

[Description of Structure]

FIG. 1 is a cross-sectional view showing a configuration of the semiconductor device of the present embodiment. The semiconductor device shown in FIG. 1 is a MIS (Metal Insulator Semiconductor) field effect transistor (FET) using nitride semiconductor.

As shown in FIG. 1, the semiconductor device of the present embodiment has a gate electrode GE disposed over a channel layer CH made of nitride semiconductor with a gate insulating film GI interposed therebetween. Herein, the gate insulating film GI includes a first gate insulating film GIa formed on the channel layer CH and a second gate insulating film GIb formed on the first gate insulating film GIa. The first gate insulating film GIa is made of oxide of first metal. The second gate insulating film GIb is made of oxide of second metal. Also, electronegativity of the second metal is lower than electronegativity of the first metal.

In addition, the first gate insulating film GIa is not a film formed by thermally oxidizing the channel layer (nitride semiconductor) CH, but is a film formed by a so-called deposition method.

In addition, the first gate insulating film GIa is thicker than the second gate insulating film GIb. In other words, a film thickness of the first gate insulating film GIa is larger than a film thickness of the second gate insulating film GIb.

The first metal is, for example, aluminum (Al). In this case, the oxide of the first metal is aluminum oxide ($Al_2O_3$).

The second metal is one or more elements selected from a group including Hf, Zr, Ta, Ti, Nb, La, Y and Mg. In this case, the oxide of the second metal is, for example, hafnium oxide ($HfO_2$), zirconium oxide (ZrO), tantalum oxide ($Ta_2O_5$), titanium oxide ($TiO_2$), niobium oxide ($Nb_2O_5$), lanthanum oxide ($La_2O_3$), yttrium oxide ($Y_2O_3$) or magnesium oxide (MgO). The composition ratio between the second metal and oxygen is not limited to those described above. In addition, two or more kinds of elements may be contained as the second metal. In this case, the oxide of the second metal is the compound of two kinds of metal and oxygen. In this case, however, all of the two or more kinds of elements need to have electronegativity lower than that of the first metal. In addition, the oxide of the second metal does not contain the first metal or a metal element whose electronegativity is lower than that of the first metal. However, the oxide of the second metal may contain the first metal or a metal element whose electronegativity is lower than that of the first metal at a level of impurities (for example, metal of 0.01% or less).

As described above, in the present embodiment, oxides of the first metal and the second metal different in electronegativity are laminated and used as the gate insulating film GI and the oxide film of the second metal with lower electronegativity is disposed as an upper layer, and it is thus possible to shift the threshold voltage (Vth) in a positive direction. Further, it is possible to make the threshold voltage (Vth) positive (Vth>0) by adjusting the shift amount.

Figure 2:
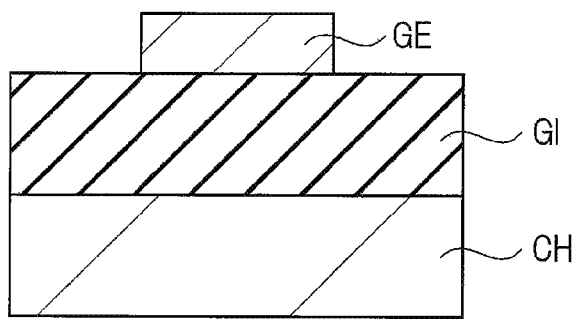
FIG. 2 is a cross-sectional view showing a configuration of a semiconductor device of a first comparative example of the first embodiment.

For example, when a single layer of an aluminum oxide film is used as the gate insulating film GI as shown in the first comparative example of FIG. 2, the threshold voltage (Vth) becomes negative (Vth<0). When the threshold voltage (Vth) becomes negative (Vth<0), it comes into a normally-on state. FIG. 2 is a cross-sectional view showing a configuration of a semiconductor device of the first comparative example of the present embodiment.

Figure 3:
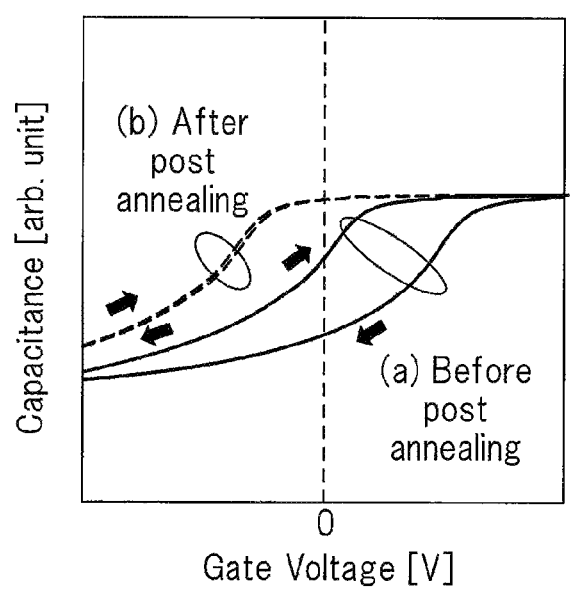
FIG. 3 is a graph showing capacitance-voltage characteristics of an aluminum oxide film before and after a heat treatment.

Namely, when an aluminum oxide film is formed by a deposition method on a nitride semiconductor layer (for example, GaN layer), the trap density in the film tends to increase. When the trap density in the film increases in this manner, the hysteresis of the capacitance-voltage characteristics (C-V characteristics) increases as shown in FIG. 3 (see graph (a) of FIG. 3). Therefore, after the formation of the aluminum oxide film, the heat treatment (post annealing) is performed to reduce the traps.

However, according to the studies by the inventors, the following results have been obtained with respect to the capacitance-voltage characteristics. FIG. 3 is a graph showing capacitance-voltage characteristics of an aluminum oxide film before and after a heat treatment (post annealing). The vertical axis represents capacitance (Capacitance [arb.unit]) and the horizontal axis represents gate voltage (Gate Voltage [V]). As shown in FIG. 3, the improvement in hysteresis can be achieved by the heat treatment. Namely, although the hysteresis is observed in the aluminum oxide film before the heat treatment (graph (a)), the hysteresis is improved in the aluminum oxide film after the heat treatment (graph (b)). However, it has also been found that the flat-band voltage (Vfb) shifts in a negative direction to be in a state of Vfb<0 V in the aluminum oxide film after the heat treatment (graph (b)).

For this reason, when the aluminum oxide film after the heat treatment (graph (b)) is applied to a gate insulating film of a MISFET, the threshold voltage (Vth) of the FET becomes negative (Vth<0) and it is thus difficult to achieve the normally-off characteristic.

Meanwhile, since the electronegativity of the second metal constituting the oxide film of the second metal laminated on an oxide film of the first metal is lower than the electronegativity of the first metal constituting the oxide film of the first metal in the present embodiment, the interfacial polarization occurs due to the difference in electronegativity. The occurrence of the interfacial polarization introduces negative charges into the oxide film of the first metal, and thus the flat-band voltage (Vfb) can be shifted in the positive direction. Accordingly, the threshold voltage (Vth) which has become negative by the heat treatment can be shifted in the positive direction. Further, it is possible to achieve the normally-off characteristic in which the threshold voltage (Vth) is positive (Vth>0) by adjusting the shift amount.

Figure 4:
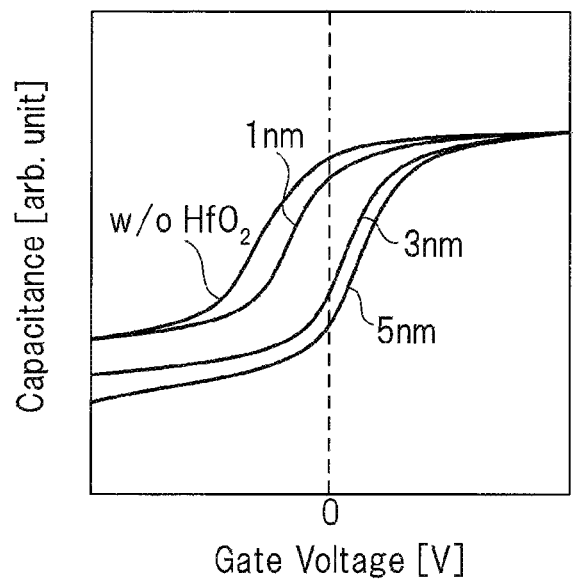
FIG. 4 is a graph showing capacitance-voltage characteristics of a gate insulating film of the first embodiment.

FIG. 4 is a graph showing capacitance-voltage characteristics of the gate insulating film of the present embodiment. A laminated film of aluminum oxide of about 100 nm and hafnium oxide thereon is used as the gate insulating film GI. The vertical axis represents capacitance (Capacitance [arb.unit]) and the horizontal axis represents gate voltage (Gate Voltage [V]).

FIG. 4 shows the graphs of the cases where the film thickness of the hafnium oxide of the upper layer is 0 nm, 1 nm, 3 nm and 5 nm, respectively. The threshold voltage (Vth) is negative (Vth<0) in the case where the film thickness of the hafnium oxide is 0 nm, that is, in the case of a single layer of an aluminum oxide film (w/o $HfO_2$), while the threshold voltage (Vth) is shifted in the positive direction as the film thickness of the hafnium oxide increases in the order of 1 nm, 3 nm and 5 nm. As described above, oxides of the first metal and the second metal different in electronegativity are laminated and used as the gate insulating film GI and the oxide film of the second metal with lower electronegativity is disposed as an upper layer, so that it has been confirmed that the threshold voltage (Vth) is shifted in the positive direction.

Further, in this case, it has been confirmed that the threshold voltage (Vth) becomes positive (Vth>0) when the film thickness of the hafnium oxide is 3 nm and 5 nm.

Through not shown in FIG. 4, the shift of the threshold voltage (Vth) in the positive direction stops after the film thickness of the hafnium oxide exceeds 10 nm, and the threshold voltage (Vth) does not increase further.

Therefore, the film thickness of the hafnium oxide (the oxide film of the second metal) is preferably 1 nm or more and 10 nm or less and more preferably 3 nm or more and 5 nm or less. In addition, when the hafnium oxide (the oxide film of the second metal) becomes too thick, the gate insulating film also becomes thick in total. This causes the mobility reduction due to the reduction in transistor driving current. Further, when the hafnium oxide (the oxide film of the second metal) is formed thicker than necessary, the processing time in the film formation process becomes long, and this causes practical problems such as the reduction in mass productivity and the increase in manufacturing cost. Therefore, the hafnium oxide (the oxide film of the second metal) is preferably thinner than the aluminum oxide film of the lower layer (the oxide film of the first metal) and has a film thickness of 10 nm or less.

The case where an aluminum oxide film and a hafnium oxide film are used as a film of a lower layer and a film of an upper layer has been described here, and the film of the lower layer inherently needs to have main characteristics of a gate insulating film such as an insulation property (leakage current) and insulation breakdown resistance and is thus required to have a certain degree of film thickness (for example, 30 nm or more in terms of equivalent $SiO_2$ thickness, that is, 30 nm or more in an $SiO_2$ film and 60 nm or more in an $Al_2O_3$ film). On the other hand, it is sufficient if the film of the upper layer has a film thickness capable of causing the polarization at the interface between the film of the upper layer and the film of the lower layer, and it is considered that the film thickness which causes the polarization is preferably 1 nm or more and 10 nm or less and more preferably 3 nm or more and 5 nm or less even when an oxide film of another second metal (for example, Zr, Ta, Ti, Nb, La, Y or Mg) is used.

Meanwhile, as another example of the MISFET using a laminated insulating films as a gate insulating film, there is a MISFET (second comparative example) in which a laminated film of a silicon oxide film ($SiO_2$) on a Si substrate and hafnium oxide ($HfO_2$) thereon is used as a gate insulating film.

The reason why an HfO$_2$ film which is a high dielectric constant film is used as a gate insulating film in this manner is to suppress the gate leakage current. Namely, when the film thickness of the silicon oxide film (SiO$_2$) used also as the gate insulating film is excessively reduced (for example, 2 nm or less) due to the miniaturization of the MISFET, the gate leakage current increases. Accordingly, the effective film thickness of the gate insulating film is increased by using a high dielectric constant film, thereby reducing the gate leakage current.

In addition, when a HfO$_2$/SiO$_2$ laminated film on a Si substrate is used as a gate insulating film, a general method of implantation of impurity ions into a Si channel and activation thereof can be used for the adjustment of the threshold voltage. Meanwhile, the threshold voltage control by this method is not possible in the case of nitride semiconductor (in particular, GaN). This is because there is the problem that even when a p type impurity is introduced into nitride semiconductor (GaN), the activation efficiency is excessively low and the introduction of a high-concentration impurity capable of achieving the high threshold is difficult. Namely, when a HfO$_2$/SiO$_2$ laminated film on a Si substrate is used as a gate insulating film, the problem that the control to a high threshold is difficult is not present from the beginning, and this is the problem unique to the case of a nitride semiconductor substrate.

Herein, in the MISFET of the second comparative example, SiO$_2$ is provided by thermally oxidizing a Si substrate in order to improve the interfacial state between the Si substrate and a high dielectric constant film. Therefore, it is preferable that the SiO$_2$ film is formed to be extremely thin (for example, 2 nm or less). The excessive increase of the film thickness of SiO$_2$ goes against the increase of dielectric constant. Meanwhile, since the SiO$_2$ film is provided for improving the interfacial state between the Si substrate and the high dielectric constant film, it must be the film formed by thermally oxidizing the Si substrate, and a film formed by a deposition method, for example, the CVD (Chemical Vapor Deposition) method cannot improve the interfacial state with the Si substrate.

To the contrary, the oxide film of the first metal of the lower layer of the gate insulating film of the present embodiment is not the film formed by thermally oxidizing the nitride semiconductor layer (or nitride semiconductor substrate) under the gate insulating film. Namely, the oxide film of the first metal of the lower layer is not an oxide of an element constituting the nitride semiconductor layer. In other words, the first metal is different from the element constituting the nitride semiconductor layer. The thermal oxide film of the nitride semiconductor layer does not have good insulation property and cannot be used as a gate insulating film. Therefore, the oxide film of the first metal of the lower layer is a film formed by a deposition method such as the CVD method or the ALD (Atomic Layer Deposition) method. In addition, the oxide film of the first metal of the lower layer is relatively thickly formed and has a film thickness of, for example, 30 nm or more. Meanwhile, the oxide film of the second metal of the upper layer does not need to have a large film thickness because the effect of shifting the flat-band voltage (Vfb) in the positive direction is uniform in a certain film thickness or more as described above. For example, the film thickness of 10 nm or less is enough. As described above, the oxide film of the second metal of the upper layer is thinner than the oxide film of the first metal of the lower layer.

Figure 5:
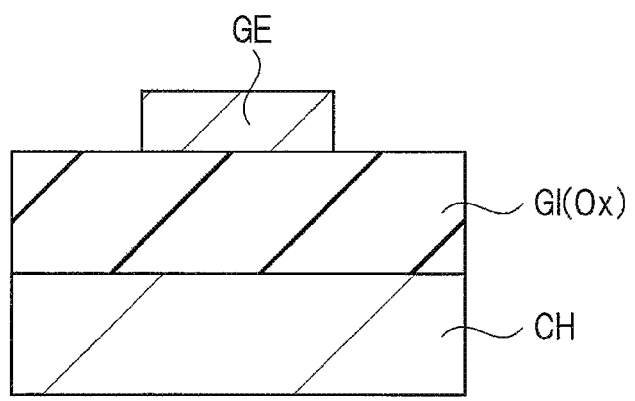
FIG. 5 is a cross-sectional view showing a configuration of a semiconductor device of a third comparative example of the first embodiment.

Therefore, when an oxide film Ox obtained by directly oxidizing the channel layer (nitride semiconductor layer) CH like in a third comparative example is used as the gate insulating film GI in the MISFET of the present embodiment, it cannot exert the function as the gate insulating film. In addition, even when the oxide film of the second metal is laminated on the oxide film Ox obtained by directly oxidizing the channel layer (nitride semiconductor layer) CH, it cannot exert the function as the gate insulating film. FIG. 5 is a cross-sectional view showing a configuration of a semiconductor device of the third comparative example of the present embodiment.

Also, when the oxide film of the first metal of the lower layer is formed to be extremely thin (for example, 2 nm or less) in the MISFET of the present embodiment like in the second comparative example, it cannot exert the function as the gate insulating film. To the contrary, when the film of the lower layer of the gate insulating film is formed by a deposition method such as the CVD method or the ALD method in the MISFET of the second comparative example like in the MISFET of the present embodiment, the interfacial state between the substrate and the film of the lower layer becomes bad and the operating characteristics of the MISFET are deteriorated. In addition, when the film of the lower layer of the gate insulating film is relatively thickly formed (for example, 30 nm or more) in the MISFET of the second comparative example like in the MISFET of the present embodiment, a driving force such as an operation speed is lowered. Also, when the film of the lower layer of the gate insulating film is relatively thickly formed (for example, 30 nm or more) and the film of the upper layer is laminated thereon in the MISFET of the second comparative example, a driving force such as an operation speed is similarly lowered.

Also, since the MISFET of the present embodiment is required to have a withstand voltage of a high voltage region, the total film thickness of the gate insulating film is several ten times as large as that of the MISFET of the second comparative example which is miniaturized and driven at a low voltage. For example, in the HfO$_2$/SiO$_2$ of the second comparative example, the film thickness is 1 nm or less in both of the upper layer and the lower layer. Meanwhile, in the MISFET of the present embodiment, for example, HfO$_2$ is about 1 nm to 10 nm and SiO$_2$ is about 30 nm to 100 nm.

As described above, in the present embodiment, in the MISFET formed on the main surface of the nitride semiconductor layer, the laminated film of the oxide film of the first metal (first gate insulating film GIa), which is not a film obtained by directly oxidizing the nitride semiconductor layer, and the oxide film of the second metal (second gate insulating film GIb) whose electronegativity is lower than that of the first metal is used as the gate insulating film GI, so that it is possible to shift the threshold voltage (Vth) in the positive direction. Further, it is possible to achieve the normally-off characteristic in which the threshold voltage (Vth) is positive (Vth>0) by adjusting the shift amount.

[Description of Manufacturing Method]

Next, a manufacturing method of the semiconductor device of the present embodiment will be described and the configuration of the semiconductor device will be more clarified with reference to FIGS. 6 to 9. FIGS. 6 to 9 are cross-sectional views showing a manufacturing process of the semiconductor device of the present embodiment.

Figure 6:
FIG. 6 is a cross-sectional view showing a manufacturing process of the semiconductor device of the first embodiment.

As shown in FIG. 6, a substrate having the channel layer CH formed therein is prepared. The channel layer CH is a nitride semiconductor layer and uses, for example, a gallium nitride layer containing n type impurity ions (nGaN layer). An nGaN substrate may be prepared as a substrate to use it as the channel layer CH. In addition, it is also possible to form an nGaN layer by heteroepitaxial growth using the metal organic chemical vapor deposition (MOCVD) method on a support substrate such as a Si substrate and use the nGaN layer as the channel layer CH.

First, a surface of the channel layer (nGaN layer, nGaN substrate) CH is cleaned with diluted HCl solution or the like. Then, the gate insulating film GI having the first gate insulating film GIa and the second gate insulating film GIb is formed on the channel layer CH.

Figure 7:
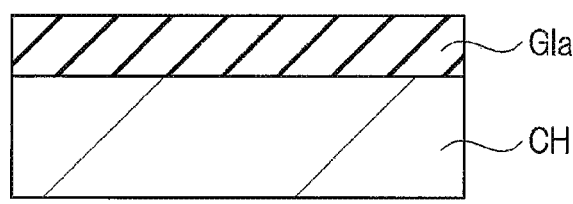
FIG. 7 is a cross-sectional view showing the manufacturing process of the semiconductor device of the first embodiment continued from FIG. 6.

First, as shown in FIG. 7, the first gate insulating film (the oxide film of the first metal) GIa is formed on the channel layer CH. For example, an aluminum oxide film ($Al_2O_3$ film) is deposited as the first gate insulating film GIa by a deposition method. For example, an aluminum oxide film ($Al_2O_3$ film) with a film thickness of about 100 nm is deposited by the ALD method using trimethylaluminum ($Al(CH_3)_3$, TMA) and $H_2O$ (oxidizing agent) as source gas in an atmosphere at 400° C. The ALD method can form a high-quality film with good controllability and coatability. Note that ozone ($O_3$) or oxygen ($O_2$) may be used as the oxidizing agent other than $H_2O$. In the ALD method, the growth of the film proceeds in two steps of adsorption reaction and oxidation reaction unlike in the CVD method. In the CVD method, aluminum oxide ($Al_2O_3$) is generated from TMA and $H_2O$ and is adsorbed onto the substrate. On the other hand, in the ALD method, the process in which TMA is first adsorbed onto the surface of a film of a lower layer and is reacted with $H_2O$ to form a layer of aluminum oxide ($Al_2O_3$) is repeatedly performed to increase the film thickness.

Next, the heat treatment is performed. For example, the heat treatment is performed in nitrogen ($N_2$) atmosphere at 750° C. for about 1 minute. This heat treatment reduces the traps (defects) in the first gate insulating film GIa (here, aluminum oxide film). In particular, when aluminum oxide is formed on GaN by the deposition method, the trap density in the film increases, so that the hysteresis of the capacitance-voltage characteristics (C-V characteristics) increases as described above (see graph (a) of FIG. 3). Thus, the heat treatment (post annealing) is performed to reduce the trap density and improve the hysteresis.

Figure 8:
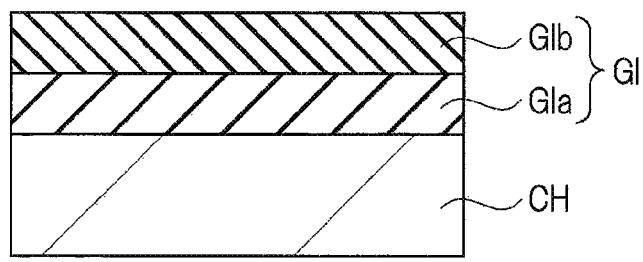
FIG. 8 is a cross-sectional view showing the manufacturing process of the semiconductor device of the first embodiment continued from FIG. 7.

Next, as shown in FIG. 8, for example, a hafnium oxide film ($HfO_2$ film) is formed as the second gate insulating film (the oxide film of the second metal) GIb on the first gate insulating film GIa (here, aluminum oxide film). The hafnium oxide film is deposited by, for example, the reactive sputtering method using Hf metal target and mixed gas of argon (Ar) and oxygen ($O_2$). A film thickness of the hafnium oxide film is preferably about 1 to 10 nm. The threshold potential (Vth) of the semiconductor device of the present embodiment is, for example, about +1 to +4 V. When the threshold potential (Vth) is made higher than +4 V, the film thickness of the hafnium oxide film may be made larger than the above-described range. The reactive sputtering method is one type of the PVD methods. The ALD method or the CVD method may be used for the formation of the second gate insulating film GIb other than the PVD (Physical Vapor Deposition) method.

Next, the heat treatment is performed. For example, the heat treatment is performed in nitrogen ($N_2$) atmosphere at 750° C. for about 1 minute. This heat treatment reduces the traps (defects) in the second gate insulating film GIb (here, hafnium oxide film). In the above-described process, the heat treatment after the formation of the first gate insulating film GIa (aluminum oxide film) and the heat treatment after the formation of the second gate insulating film GIb (hafnium oxide film) are separately performed, but the heat treatment may be collectively performed after the formation of a laminated film of the first gate insulating film GIa (aluminum oxide film) and the second gate insulating film GIb (hafnium oxide film) by omitting the heat treatment after the formation of the first gate insulating film GIa.

In this manner, the gate insulating film GI having the laminated film of the first gate insulating film GIa (aluminum oxide film) and the second gate insulating film GIb (hafnium oxide film) is formed.

Figure 9:
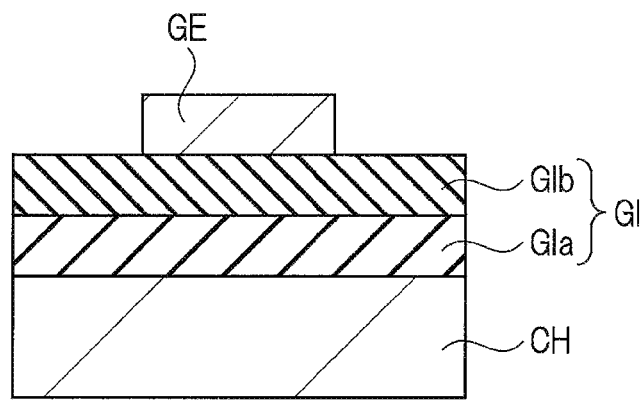
FIG. 9 is a cross-sectional view showing the manufacturing process of the semiconductor device of the first embodiment continued from FIG. 8.

Next, as shown in FIG. 9, the gate electrode GE is formed on the gate insulating film GI. For example, a titanium nitride (TiN) film as a conductive film is formed on the gate insulating film GI. The titanium nitride film with a film thickness of about 100 nm is deposited by, for example, the reactive sputtering method using Ti metal target and mixed gas of argon (Ar) and nitrogen ($N_2$). The ALD method or the CVD method may be used for the formation of the gate electrode GE other than the PVD method. Next, the titanium nitride film is patterned by using the photolithography technique and the etching technique, thereby forming the gate electrode GE. Note that the gate insulating film GI of the lower layer may be etched in the etching of the titanium nitride film. In addition, metal such as Ti, Ta, TaN, Au, Al, W, WN, Ir, Pt and Ru or metal compound thereof may be used as a material to form the gate electrode GE other than the TiN film. Also, a film obtained by laminating two or more kinds of these metals or metal compounds may be used.

As described above, according to the present embodiment, the oxide film of the first metal and the oxide film of the second metal whose electronegativity is lower than that of the first metal are laminated and used as the gate insulating film, and thus the threshold voltage (Vth) can be shifted in the positive direction.

In particular, even when the heat treatment to reduce the trap density in the oxide film is performed, the threshold voltage (Vth) which has been shifted in the negative direction can be returned in the positive direction.

Figure 10:
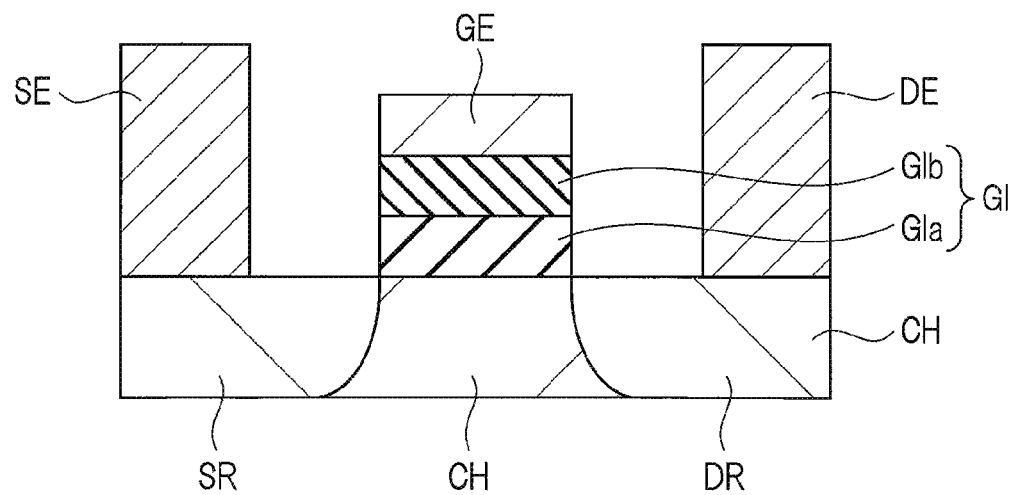
FIG. 10 is a cross-sectional view showing another configuration of the semiconductor device of the first embodiment.

Note that a source electrode SE and a drain electrode DE are not described in the semiconductor device (MISFET) shown in FIG. 1, but a source region SR and a drain region DR may be formed by, for example, introducing an n type impurity or a p type impurity into the channel layer (nitride semiconductor) CH on both sides of the gate electrode GE as shown in FIG. 10. Then, the source electrode SE and the drain electrode DE may be further provided on the source region SR and the drain region DR, respectively. FIG. 10 is a cross-sectional view showing another configuration of the semiconductor device of the present embodiment.

Figure 11:
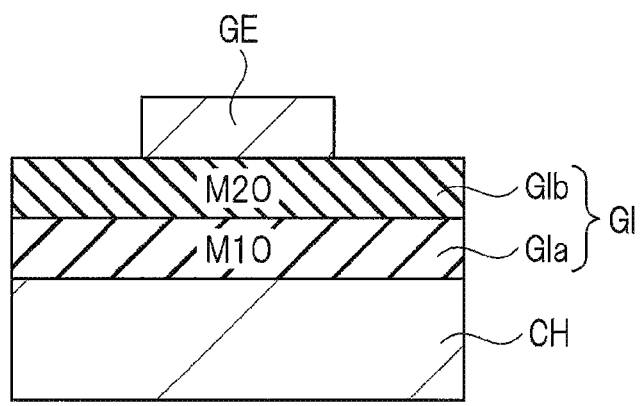
FIG. 11 is a cross-sectional view showing a characteristic configuration of the semiconductor device of the first embodiment.

A characteristic configuration of the semiconductor device of the present embodiment will be described below with reference to FIG. 11. FIG. 11 is a cross-sectional view showing a characteristic configuration of the semiconductor device of the present embodiment.

The semiconductor device of the present embodiment includes the gate electrode GE formed over the channel layer (nitride semiconductor) CH with the gate insulating film GI interposed therebetween as shown in FIG. 11.

The gate insulating film GI includes an oxide film M1O of a first metal M1 formed on the channel layer (nitride semiconductor) CH and an oxide film M2O of a second metal M2 formed on the oxide film M1O. It goes without saying that the composition ratio between M1 and O and the composition ratio between M2 and O vary depending on the elements to be selected.

Also, the electronegativity of the second metal M2 is lower than the electronegativity of the first metal M1. The first metal M1 and the second metal M2 are selected from the second group, the third group, the fourth group, the fifth group and the thirteenth group shown in the table 1 below (Pauling electronegativity). It is particularly preferable that oxides of the first metal M1 and the second metal M2 are present in a solid form in a range of the device operation temperature (for example, <200° C.) and thin films thereof have good insulation. A combination of the oxide film of the lower layer and the oxide film of the upper layer may be selected from these metals in consideration of the relationship in electronegativity.

Al is preferable as the first metal M1, that is, the metal (element) constituting the oxide film of the lower layer. In addition, Si (the fourteenth group) may be used as described in the second embodiment below. When the surface of the nitride semiconductor is oxidized in the formation of the oxide of the first metal, an interfacial oxide layer with low insulation is formed and the characteristics of the gate insulating film are lost. The oxide of Al, that is, aluminum oxide is preferably used as the lower layer because the interfacial reaction layer is less likely to be formed even if the aluminum oxide is formed on the nitride semiconductor (in particular, GaN).

GI includes a silicon oxide film ($SiO_2$) serving as the first gate insulating film GIa formed on the channel layer CH and a second gate insulating film (an oxide film of the second metal) GIb formed on the first gate insulating film GIa. As described above, Si is used instead of the first metal of the first embodiment. Namely, the first gate insulating film GIa is made of oxide of Si which is semiconductor. The second gate insulating film GIb is made of oxide of second metal. Also, electronegativity of the second metal is lower than electronegativity of Si (semiconductor).

In addition, the silicon oxide film serving as the first gate insulating film GIa is not a film formed by thermally oxidizing the channel layer (nitride semiconductor) CH, but is a film formed by a so-called deposition method. Namely, the oxide film of Si of the lower layer is not an oxide of an element constituting the nitride semiconductor layer. As described above, since the oxide film of Si is not the film formed by directly oxidizing the channel layer (nitride semiconductor), Si is different from the element constituting the channel layer (nitride semiconductor).

In addition, the silicon oxide film serving as the first gate insulating film GIa is thicker than the second gate insulating film GIb. In other words, a film thickness of the silicon oxide film serving as the first gate insulating film GIa is larger than a film thickness of the second gate insulating film GIb.

TABLE 1

| Group | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| Period | | | | | | | | | | | | | | | | | | |
| 1 | H 2.20 | | | | | | | | | | | | | | | | | He |
| 2 | Li 0.98 | Be 1.57 | | | | | | | | | | | B 2.04 | C 2.55 | N 3.04 | O 3.44 | F 3.98 | Ne |
| 3 | Na 0.93 | Mg 1.31 | | | | | | | | | | | Al 1.61 | Si 1.90 | P 2.19 | S 2.58 | Cl 3.16 | Ar |
| 4 | K 0.82 | Ca 1.00 | Sc 1.36 | Ti 1.54 | V 1.63 | Cr 1.66 | Mn 1.55 | Fe 1.83 | Co 1.88 | Ni 1.91 | Cu 1.90 | Zn 1.65 | Ga 1.81 | Ge 2.01 | As 2.18 | Se 2.55 | Br 2.96 | Kr 3.00 |
| 5 | Rb 0.82 | Sr 0.95 | Y 1.22 | Zr 1.33 | Nb 1.6 | Mo 2.16 | Tc 1.9 | Ru 2.2 | Rh 2.28 | Pd 2.20 | Ag 1.93 | Cd 1.69 | In 1.78 | Sn 1.96 | Sb 2.05 | Te 2.1 | I 2.66 | Xe 2.6 |
| 6 | Cs 0.79 | Ba 0.89 | * | Hf 1.3 | Ta 1.5 | W 2.36 | Re 1.9 | Os 2.2 | Ir 2.20 | Pt 2.28 | Au 2.54 | Hg 2.00 | Tl 1.62 | Pb 2.33 | Bi 2.02 | Po 2.0 | At 2.2 | Rn |
| 7 | Fr 0.7 | Ra 0.9 | ** | Rf | Db | Sg | Bh | Hs | Mt | Ds | Rg | Cn | Uut | Fl | Uup | Lv | Uus | Uuo |
| Lanthanides | * | La 1.1 | Ce 1.12 | Pr 1.13 | Nd 1.14 | Pm 1.13 | Sm 1.17 | Eu 1.2 | Gd 1.2 | Tb 1.1 | Dy 1.22 | Ho 1.23 | Er 1.24 | Tm 1.25 | Yb 1.1 | Lu 1.27 | | |
| Actinides | ** | Ac 1.1 | Th 1.3 | Pa 1.5 | U 1.38 | Np 1.36 | Pu 1.28 | Am 1.13 | Cm 1.28 | Bk 1.3 | Cf 1.3 | Es 1.3 | Fm 1.3 | Md 1.3 | No 1.3 | Lr | | |

Second Embodiment

In the first embodiment (FIG. 1), the oxide film of the first metal (for example, aluminum oxide film) is used as the film of the lower layer (GIa) of the gate insulating film GI. Meanwhile, in the present embodiment, Si (semiconductor) is used as an element constituting the film of the lower layer (GIa) of the gate insulating film GI.

[Description of Structure]

Figure 12:
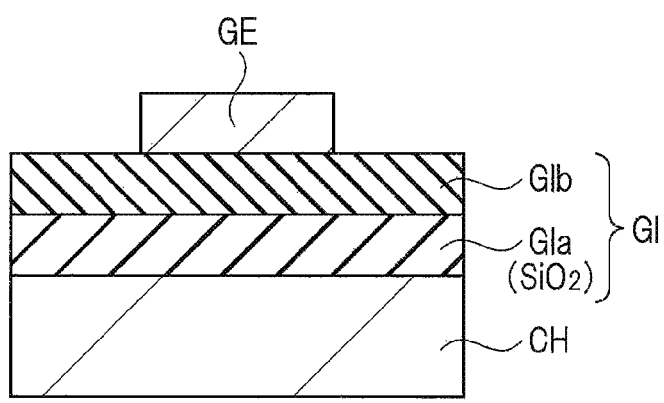
FIG. 12 is a cross-sectional view showing a configuration of a semiconductor device of a second embodiment.

FIG. 12 is a cross-sectional view showing a configuration of a semiconductor device of the present embodiment. As shown in FIG. 12, the semiconductor device of the present embodiment has the gate electrode GE disposed over the channel layer CH made of nitride semiconductor with the gate insulating film GI interposed therebetween like in the case of the first embodiment. Herein, the gate insulating film For example, the film thickness of the first gate insulating film GIa (silicon oxide film) is preferably about 30 nm or more.

For example, the film thickness of the hafnium oxide (the oxide film of the second metal) serving as the second gate insulating film GIb is preferably 1 nm or more and 10 nm or less and more preferably 3 nm or more and 5 nm or less.

The second metal is one or more elements selected from a group including Al, Hf, Zr, Ta, Ti, Nb, La, Y and Mg. In this case, the oxide of the second metal is, for example, aluminum oxide ($Al_2O_3$), hafnium oxide ($HfO_2$), zirconium oxide (ZrO), tantalum oxide ($Ta_2O_5$), titanium oxide ($TiO_2$), niobium oxide ($Nb_2O_5$), lanthanum oxide ($La_2O_3$), yttrium oxide ($Y_2O_3$) or magnesium oxide (MgO). The composition ratio between the second metal and oxygen is not limited to those described above. In addition, two or more kinds of elements may be contained as the second metal. In this case, the oxide of the second metal is the compound of two kinds of metal and oxygen. In this case, however, all of the two or more kinds of elements need to have electronegativity lower than that of Si. In addition, the oxide of the second metal does not contain Si or a metal element whose electronegativity is lower than that of Si. However, the oxide of the second metal may contain Si or a metal element whose electronegativity is lower than that of Si at a level of impurities (for example, metal of 0.01% or less).

As described above, in the present embodiment, oxides of Si and the second metal different in electronegativity are laminated and used as the gate insulating film GI and the oxide film of the second metal whose electronegativity is lower than that of Si is disposed as an upper layer, and it is thus possible to shift the threshold voltage (Vth) in a positive direction like in the case of the first embodiment.

Further, since a silicon oxide film ($SiO_2$) is used as the first gate insulating film GIa in the present embodiment, the effect of shifting the threshold voltage (Vth) in the positive direction is greater in comparison with the case of using aluminum oxide ($Al_2O_3$) described in the first embodiment. Namely, since the electronegativity of Si and Al has the relation of Al<Si (see table 1), when an oxide film of the same second metal (except for Al) is used as the second gate insulating film GIb, the electronegativity of Si, Al and the second metal has the relation of the second metal<Al<Si.

Therefore, the difference in electronegativity becomes larger in the combination of the second metal and Si than in the combination of the second metal and Al. The origin of the interfacial polarization described in the first embodiment is the difference in electronegativity, and the interfacial polarization quantity increases as the difference becomes larger. Therefore, when a silicon oxide film ($SiO_2$) is used as the gate insulating film (GIa) of the lower layer, the effect of shifting the threshold voltage (Vth) in the positive direction is greater in comparison with the case of using aluminum oxide ($Al_2O_3$). In addition, since the silicon oxide film exhibits good insulation even in the form of thin film, it is preferably used as the lower layer of the gate insulating film GI.

[Description of Manufacturing Method]

Next, a manufacturing method of the semiconductor device of the present embodiment will be described. The manufacturing method of the semiconductor device of the present embodiment is the same as that of the first embodiment except that a silicon oxide film is formed as the first gate insulating film GIa instead of the oxide film of the first metal.

Specifically, a surface of the channel layer (nGaN layer, nGaN substrate) CH is cleaned in the same manner as the first embodiment, and a silicon oxide film ($SiO_2$ film) is deposited as the first gate insulating film GIa on the channel layer CH by a deposition method.

For example, a silicon oxide film ($SiO_2$ film) with a film thickness of about 50 nm is deposited by the ALD method using trisdimethylaminosilane ($SiH(N(CH_3)_2)_3$, TDMAS) and ozone ($O_3$, oxidizing agent) as source gas in an atmosphere at 480° C. The silicon oxide film may be deposited by the CVD method (thermal CVD method, plasma CVD method or the like) other than the ALD method.

The ALD method can form a high-quality film with good controllability and coatability. In the ALD method, the growth of the film proceeds in two steps of adsorption reaction and oxidation reaction unlike the CVD method. In the CVD method, silicon oxide ($SiO_2$) is generated from TDMAS and ozone and is adsorbed onto the substrate. On the other hand, in the ALD method, the process in which TDMAS is adsorbed onto the surface of a film of a lower layer and is reacted with ozone to form a layer of silicon oxide ($SiO_2$) is repeatedly performed to increase the film thickness.

Next, the heat treatment is performed. For example, the heat treatment is performed in nitrogen ($N_2$) atmosphere at 750° C. for about 30 minutes. This heat treatment reduces the traps (defects) in the first gate insulating film GIa (here, silicon oxide film).

Thereafter, a hafnium oxide film ($HfO_2$ film) is formed as the second gate insulating film GIb on the first gate insulating film GIa (here, silicon oxide film) in the same manner as the first embodiment. The hafnium oxide film is deposited by, for example, the reactive sputtering method using Hf metal target and mixed gas of argon (Ar) and oxygen ($O_2$). A film thickness of the hafnium oxide film is preferably about 1 to 10 nm though it differs depending on the threshold potential (Vth). The reactive sputtering method is one type of the PVD methods. The ALD method or the CVD method may be used for the formation of the second gate insulating film GIb other than the PVD method.

Next, the heat treatment is performed. For example, the heat treatment is performed in nitrogen ($N_2$) atmosphere at 750° C. for about 1 minute. This heat treatment reduces the traps (defects) in the second gate insulating film GIb (here, hafnium oxide film). In the above-described process, the heat treatment after the formation of the first gate insulating film GIa (silicon oxide film) and the heat treatment after the formation of the second gate insulating film GIb (hafnium oxide film) are separately performed, but the heat treatment may be collectively performed after the formation of a laminated film of the first gate insulating film GIa (silicon oxide film) and the second gate insulating film GIb (hafnium oxide film) by omitting the heat treatment after the formation of the first gate insulating film GIa.

In this manner, the gate insulating film GI having the laminated film of the first gate insulating film GIa (silicon oxide film) and the second gate insulating film GIb (hafnium oxide film) is formed. Herein, Hf is shown as an example of the second metal, but the second metal is one or more elements selected from the group including, for example, Al, Hf, Zr, Ta, Ti, Nb, La, Y and Mg. For example, an oxide of one or more elements selected from the group including Al, Hf, Zr, Ta, Ti, Nb, La, Y and Mg may be used as the oxide of the second metal.

Next, the gate electrode GE is formed on the gate insulating film GI in the same manner as the first embodiment.

As described above, according to the present embodiment, the silicon oxide film and the oxide film of the second metal whose electronegativity is lower than that of Si are laminated and used as the gate insulating film, and thus the threshold voltage (Vth) can be shifted in the positive direction.

In particular, even when the heat treatment to reduce the trap density in the oxide film is performed, the threshold voltage (Vth) which has been shifted in the negative direction can be returned in the positive direction.

Also in the present embodiment, a source region SR and a drain region DR may be formed by, for example, introducing an n type impurity or a p type impurity into the channel layer (nitride semiconductor) CH on both sides of the gate electrode GE, and a source electrode SE and a drain electrode DE may be further provided on the source region SR and the drain region DR, respectively (see FIG. 10).

Third Embodiment

Hereinafter, a semiconductor device of the present embodiment will be described in detail with reference to drawings.

[Description of Structure]

Figure 13:
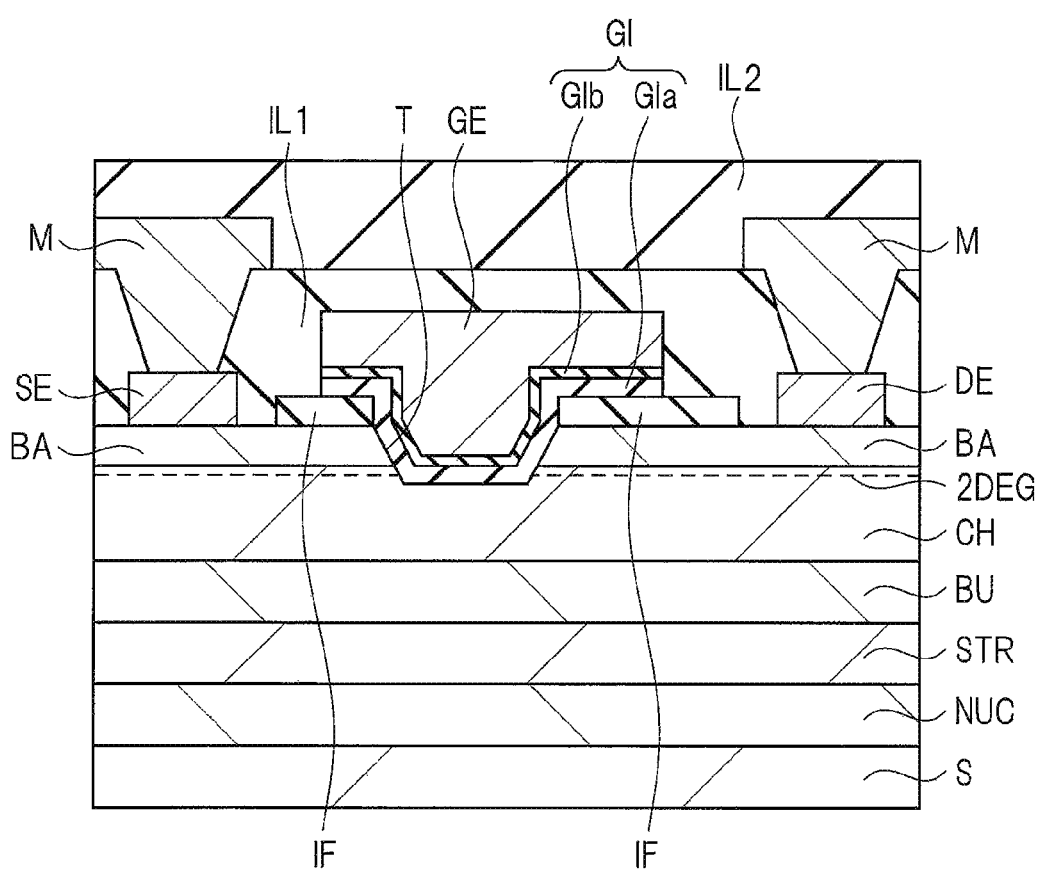
FIG. 13 is a cross-sectional view showing a configuration of a semiconductor device of a third embodiment.

FIG. 13 is a cross-sectional view showing a configuration of the semiconductor device of the present embodiment. The semiconductor device shown in FIG. 13 is a MISFET using nitride semiconductor. This semiconductor device is referred to as a high electron mobility transistor (HEMT) or a power transistor. The semiconductor device of the present embodiment is a so-called recessed gate semiconductor device.

The semiconductor device of the present embodiment includes a plurality of nitride semiconductor layers formed on a substrate S. Specifically, a nucleation layer NUC, a strain relief layer STR, a buffer layer BU, a channel layer (referred to also as electron transit layer) CH and a barrier layer BA are sequentially formed on the substrate S. The gate electrode GE is formed in a trench (referred to also as recess) T, which is formed to penetrate an insulating film IF and the barrier layer BA and reach the middle of the channel layer CH, with the gate insulating film GI interposed therebetween. Herein, the gate insulating film GI includes the first gate insulating film GIa formed on the channel layer CH and the second gate insulating film GIb formed on the first gate insulating film GIa. The first gate insulating film GIa is made of the oxide of the first metal. The second gate insulating film GIb is made of the oxide of the second metal. Also, the electronegativity of the second metal is lower than the electronegativity of the first metal. In addition, the source electrode SE and the drain electrode DE are formed on the barrier layer BA on both sides of the gate electrode GE.

Also, the silicon oxide film serving as the first gate insulating film GIa is not the film formed by thermally oxidizing the channel layer (nitride semiconductor) CH, but is the film formed by a so-called deposition method. Namely, the oxide film of the first metal of the lower layer is not the oxide of the element constituting the nitride semiconductor layer. As described above, since the oxide film of the first metal is not the film formed by directly oxidizing the channel layer (nitride semiconductor), the first metal is different from the element constituting the channel layer (nitride semiconductor).

Also, the oxide film of the first metal serving as the first gate insulating film GIa is thicker than the second gate insulating film GIb. In other words, the film thickness of the oxide film of the first metal serving as the first gate insulating film GIa is larger than the film thickness of the second gate insulating film GIb.

For example, the film thickness of the first gate insulating film GIa (the oxide film of the first metal) is preferably 30 nm or more.

For example, the film thickness of the second gate insulating film GIb (the oxide film of the second metal) is preferably 1 nm or more and 10 nm or less and more preferably 3 nm or more and 5 nm or less.

The second metal is one or more elements selected from the group including Hf, Zr, Ta, Ti, Nb, La, Y and Mg. In this case, the oxide of the second metal is, for example, hafnium oxide ($HfO_2$), zirconium oxide ($ZrO$), tantalum oxide ($Ta_2O_5$), titanium oxide ($TiO_2$), niobium oxide ($Nb_2O_5$), lanthanum oxide ($La_2O_3$), yttrium oxide ($Y_2O_3$) or magnesium oxide ($MgO$). The composition ratio between the second metal and oxygen is not limited to those described above. In addition, two or more kinds of elements may be contained as the second metal. In this case, the oxide of the second metal is the compound of two kinds of metal and oxygen. In this case, however, all of the two or more kinds of elements need to have electronegativity lower than that of the first metal. In addition, the oxide of the second metal does not contain the first metal or a metal element whose electronegativity is lower than that of the first metal. However, the oxide of the second metal may contain the first metal or a metal element whose electronegativity is lower than that of the first metal at a level of impurities (for example, metal at a concentration of 0.01% or less).

As shown in FIG. 13, the nucleation layer NUC is formed on the substrate S and the strain relief layer STR is formed on the nucleation layer NUC. The nucleation layer NUC is formed for creating crystal nuclei used when layers to be formed in an upper part such as the strain relief layer STR and others are grown. Also, the nucleation layer NUC is formed for preventing the substrate S from being modified due to the diffusion of a constituent element (for example, Ga) of the layers formed in the upper part from the layers formed in the upper part to the substrate S. In addition, the strain relief layer STR is formed for relieving the stress to the substrate S to suppress the occurrence of warpage and crack in the substrate S.

The buffer layer BU is formed on the strain relief layer STR, the channel layer (referred to also as electron transit layer) CH made of nitride semiconductor is formed on the buffer layer BU, and the barrier layer BA made of nitride semiconductor is formed on the channel layer CH. The source electrode SE and the drain electrode DE are formed on the barrier layer BA. The source electrode SE, the drain electrode DE and the barrier layer BA are ohmic-connected to each other. The insulating layer IL1 is formed on the gate electrode GE, the source electrode SE and the drain electrode DE. The insulating layer IL1 on the source electrode SE and the drain electrode DE is removed to form contact holes. A conductive film is buried in each of the contact holes and a wiring M is formed thereon. Further, an insulating layer IL2 is formed on the wiring M.

Herein, in the semiconductor device of the present embodiment, two-dimensional electron gas 2DEG is formed on aside of the channel layer CH near the interface between the channel layer CH and the barrier layer BA. Also, when a positive potential (threshold potential) is applied to the gate electrode GE, a channel C is formed near the interface between the gate electrode GE and the channel layer CH.

The two-dimensional electron gas 2DEG is formed in the following mechanism. The nitride semiconductors constituting the channel layer CH and the barrier layer BA (here, GaN-based semiconductors) are respectively different in forbidden band width (bandgap) and electron affinity. Therefore, a well potential is generated at a bonding surface of these semiconductors. Electrons are accumulated in this well potential, and thus the two-dimensional electron gas 2DEG is formed near the interface between the channel layer CH and the barrier layer BA.

Then, the two-dimensional electron gas 2DEG formed near the interface between the channel layer CH and the barrier layer BA is divided by the trench T in which the gate electrodes GE is formed. Therefore, in the semiconductor device of the present embodiment, on/off switching can be controlled by the presence or absence of the formation of the channel C.

Further, in the present embodiment, the laminated film of the oxide of the first metal and the oxide of the second metal having the electronegativity lower than that of the first metal and disposed thereon is used as the gate insulating film GI, and it is thus possible to shift the flat-band voltage (Vfb) in the positive direction like in the case of the first embodiment. Accordingly, it is possible to shift the threshold voltage (Vth) in the positive direction. Further, it is possible to make the threshold voltage (Vth) positive (Vth>0) by adjusting the shift amount, so that it is possible to improve the normally-off characteristic.

[Description of Manufacturing Method]

Next, a manufacturing method of the semiconductor device of the present embodiment will be described and the configuration of the semiconductor device will be more clarified with reference to FIGS. 14 to 23. FIGS. 14 to 23 are cross-sectional views showing a manufacturing process of the semiconductor device of the present embodiment.

Figure 14:
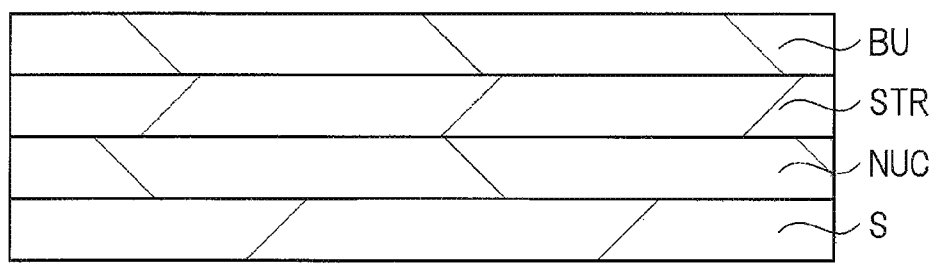
FIG. 14 is a cross-sectional view showing a manufacturing process of the semiconductor device of the third embodiment.

As shown in FIG. 14, for example, a semiconductor substrate made of silicon (Si) whose (111) surface is exposed is used as the substrate S, and an aluminum nitride (AlN) layer is heteroepitaxially grown thereon as the nucleation layer NUC by the metal organic chemical vapor deposition method or the like. Next, a superlattice structure obtained by repeatedly forming the laminated film (AlN/GaN film) of a gallium nitride (GaN) layer and an aluminum nitride (AlN) layer is formed as the strain relief layer STR on the nucleation layer NUC. For example, about 100 layers of gallium nitride (GaN) layers and aluminum nitride (AlN) layers (200 layers in total) each having a film thickness of about 2 to 3 nm are repeatedly heteroepitaxially grown by the metal organic chemical vapor deposition method or the like. Note that a substrate made of SiC or sapphire may be used as the substrate S other than that made of silicon described above.

Next, the buffer layer BU is formed on the strain relief layer STR. For example, an AlGaN layer is heteroepitaxially grown as the buffer layer BU on the strain relief layer STR by the metal organic chemical vapor deposition method or the like.

Figure 15:
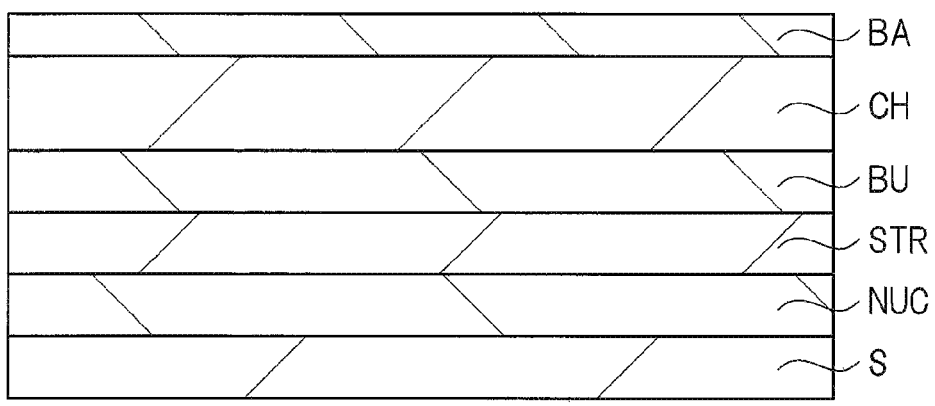
FIG. 15 is a cross-sectional view showing the manufacturing process of the semiconductor device of the third embodiment continued from FIG. 14.

Next, as shown in FIG. 15, the channel layer CH is formed on the buffer layer BU. For example, a gallium nitride layer containing n type impurity ions (nGaN layer) is heteroepitaxially grown on the buffer layer BU. For example, a gallium nitride layer doped with an n type impurity (nGaN layer) is heteroepitaxially grown in an atmosphere in which n type impurity gas is mixed in source gas of gallium nitride. Silane ($SiH_4$) can be used as the n type impurity gas. The electron affinity of the channel layer CH is higher than the electron affinity of the buffer layer BU. In addition, the channel layer CH is nitride semiconductor whose bandgap is narrower than that of the buffer layer BU.

Next, for example, an AlGaN layer is heteroepitaxially grown as the barrier layer BA on the channel layer CH by the metal organic chemical vapor deposition method or the like. The electron affinity of the barrier layer BA is lower than the electron affinity of the channel layer CH. In addition, the barrier layer BA is nitride semiconductor whose bandgap is wider than that of the channel layer CH.

In this manner, the laminated body of the buffer layer BU, the channel layer CH and the barrier layer BA is formed. This laminated body is formed by the above-described heteroepitaxial growth, that is, the III-group surface growth laminated in a [0001] crystal axis (C axis) direction. In other words, the laminated body is formed by the (0001) Ga surface growth. In this laminated body, the two-dimensional electron gas 2DEG is formed near the interface between the channel layer CH and the barrier layer BA.

Figure 16:
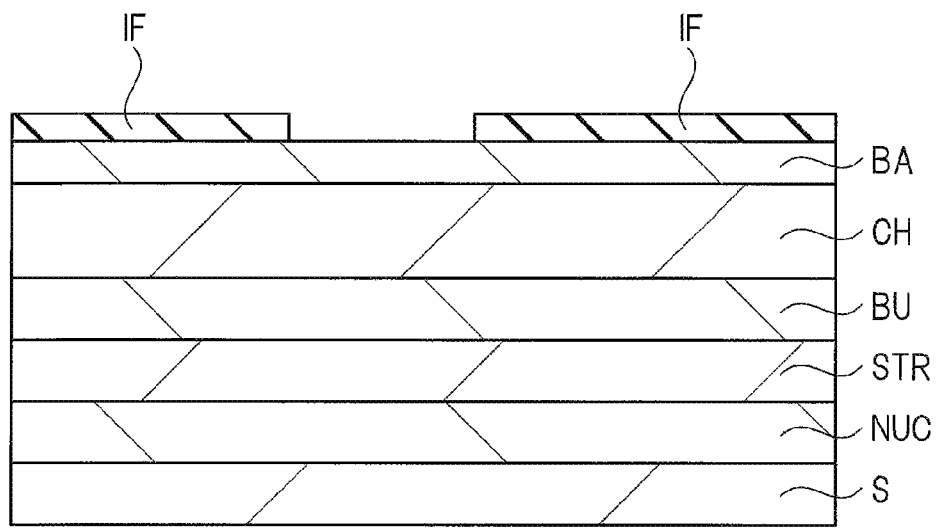
FIG. 16 is a cross-sectional view showing the manufacturing process of the semiconductor device of the third embodiment continued from FIG. 15.

Next, as shown in FIG. 16, the insulating film IF having an opening is formed on the barrier layer BA. For example, a silicon nitride film is deposited as the insulating film IF on the barrier layer BA by the thermal CVD method or the like. Then, the opening is formed in the insulating film IF by using the photolithography technique and the etching technique.

Figure 17:
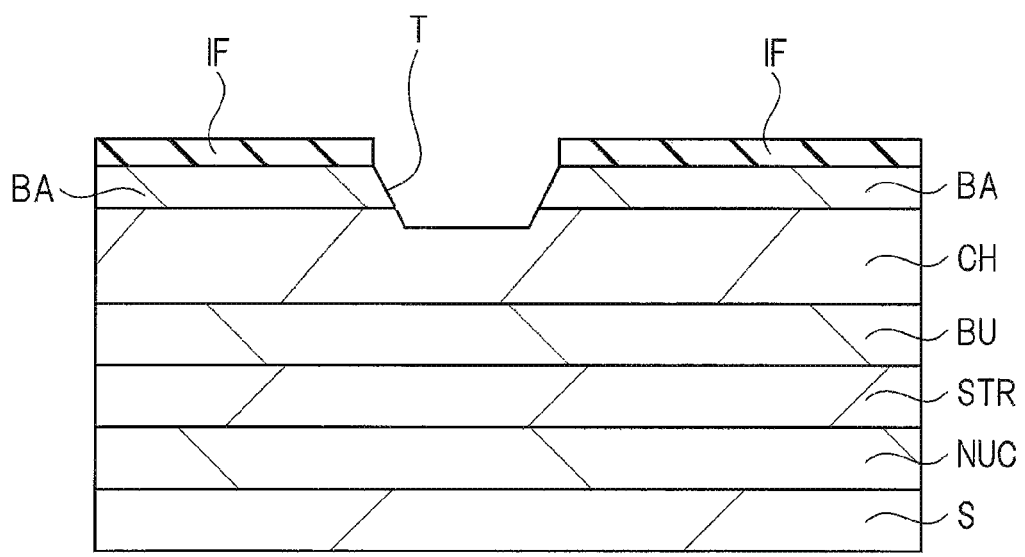
FIG. 17 is a cross-sectional view showing the manufacturing process of the semiconductor device of the third embodiment continued from FIG. 16.

Next, the barrier layer BA and the channel layer CH are etched with using the insulating film IF as a mask, thereby forming the trench T which penetrates the insulating film IF and the barrier layer BA to reach the middle of the channel layer CH (FIG. 17). After this etching, the heat treatment (annealing) may be performed for the recovery of the etching damage.

Figure 18:
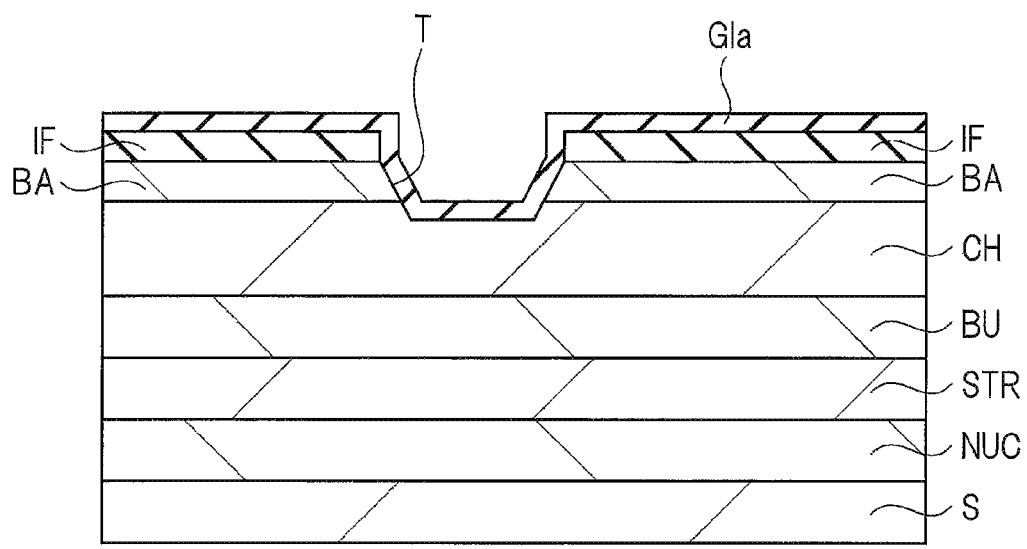
FIG. 18 is a cross-sectional view showing the manufacturing process of the semiconductor device of the third embodiment continued from FIG. 17.
Figure 19:
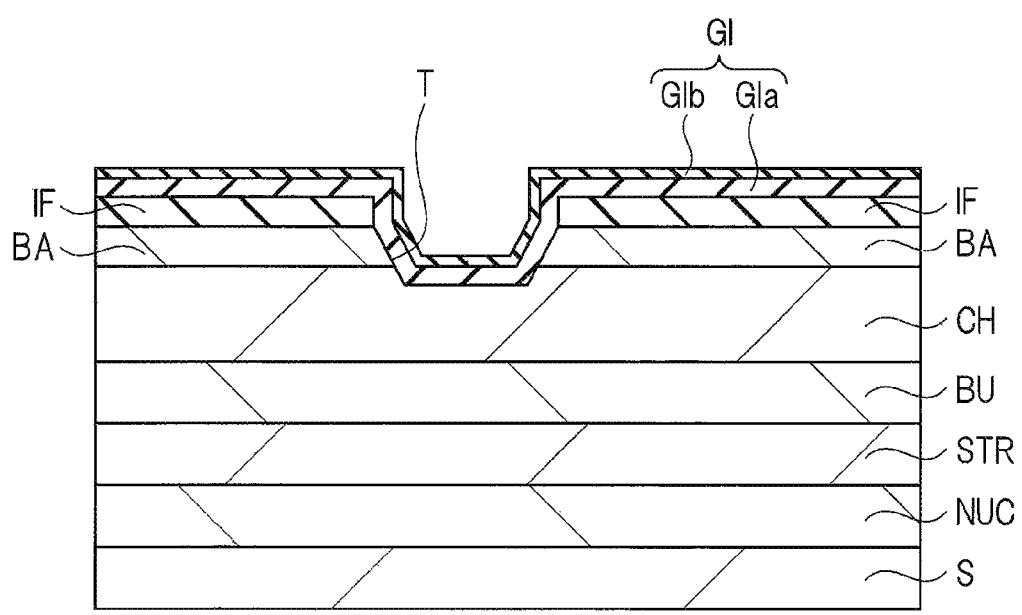
FIG. 19 is a cross-sectional view showing the manufacturing process of the semiconductor device of the third embodiment continued from FIG. 18.

Next, as shown in FIG. 18 and FIG. 19, the gate insulating film GI having the first gate insulating film GIa and the second gate insulating film GIb is formed in the trench T and on the insulating film IF. For example, the first gate insulating film GIa is formed in the trench T in which the channel layer CH is exposed at the bottom and on the insulating film IF. For example, an aluminum oxide film ($Al_2O_3$ film) is deposited as the first gate insulating film GIa on a bottom surface and a side wall of the trench T and on the insulating film IF. Specifically, after a surface of the substrate S is cleaned with diluted HCl solution, an aluminum oxide film ($Al_2O_3$ film) with a film thickness of about 100 nm is deposited in the trench T and on the insulating film IF by the ALD method using, for example, trimethylaluminum (Al ($CH_3$)$_3$, TMA) and $H_2O$ (oxidizing agent) as source gas in an atmosphere at 400° C. The ALD method has good controllability in film thickness and can form a film with good coatability even on an irregular surface. Note that ozone ($O_3$) or oxygen ($O_2$) may be used as the oxidizing agent other than $H_2O$.

Next, the heat treatment is performed. For example, the heat treatment is performed in nitrogen ($N_2$) atmosphere at 750° C. for about 1 minute. This heat treatment reduces the traps (defects) in the first gate insulating film GIa (here, aluminum oxide film). In particular, when aluminum oxide is formed on GaN by the deposition method, the trap density in the film increases, so that the hysteresis of the capacitance-voltage characteristics (C-V characteristics) increases. Thus, the heat treatment (post annealing) is performed to reduce the trap density (see FIG. 3). Next, as shown in FIG. 19, for example, a hafnium oxide film ($HfO_2$ film) is formed as the second gate insulating film GIb on the first gate insulating film GIa (here, aluminum oxide film). The hafnium oxide film is deposited by, for example, the reactive sputtering method using Hf metal target and mixed gas of argon (Ar) and oxygen ($O_2$). A film thickness of the hafnium oxide film is preferably about 1 to 10 nm though it differs depending on the threshold potential (Vth). The reactive sputtering method is one type of the PVD methods. The ALD method or the CVD method may be used for the formation of the second gate insulating film GIb other than the PVD method.

Next, the heat treatment is performed. For example, the heat treatment is performed in nitrogen ($N_2$) atmosphere at 750° C. for about 1 minute. This heat treatment reduces the traps (defects) in the second gate insulating film GIb (here, hafnium oxide film). In the above-described process, the heat treatment after the formation of the first gate insulating film GIa (aluminum oxide film) and the heat treatment after the formation of the second gate insulating film GIb (hafnium oxide film) are separately performed, but the heat treatment may be collectively performed after the formation of a laminated film of the first gate insulating film GIa (aluminum oxide film) and the second gate insulating film GIb (hafnium oxide film) by omitting the heat treatment after the formation of the first gate insulating film GIa.

In this manner, the gate insulating film GI having the laminated film of the first gate insulating film GIa (aluminum oxide film) and the second gate insulating film GIb (hafnium oxide film) is formed.

Figure 20:
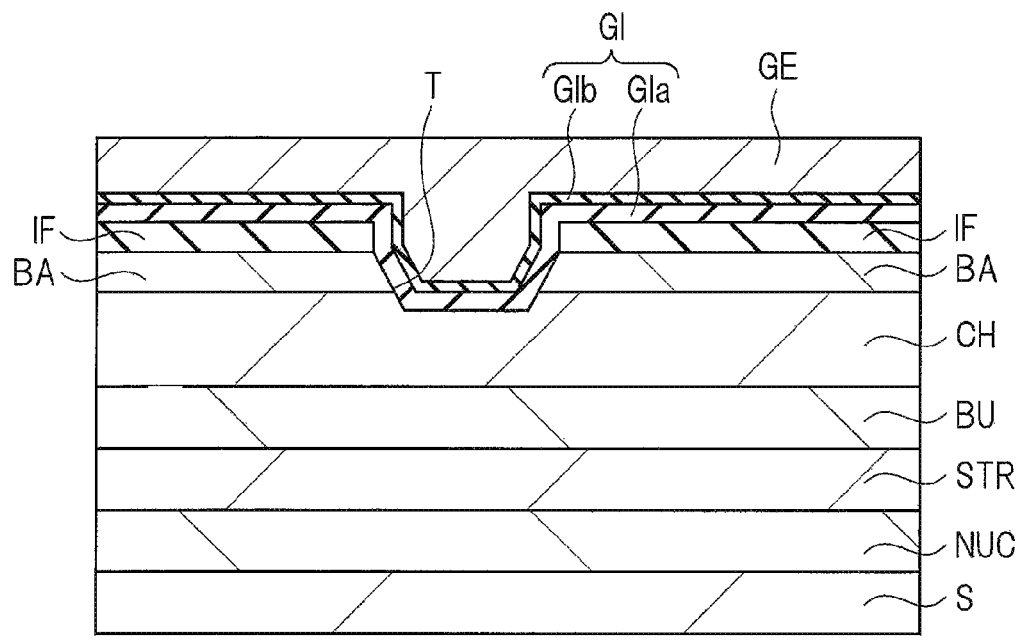
FIG. 20 is a cross-sectional view showing the manufacturing process of the semiconductor device of the third embodiment continued from FIG. 19.
Figure 21:
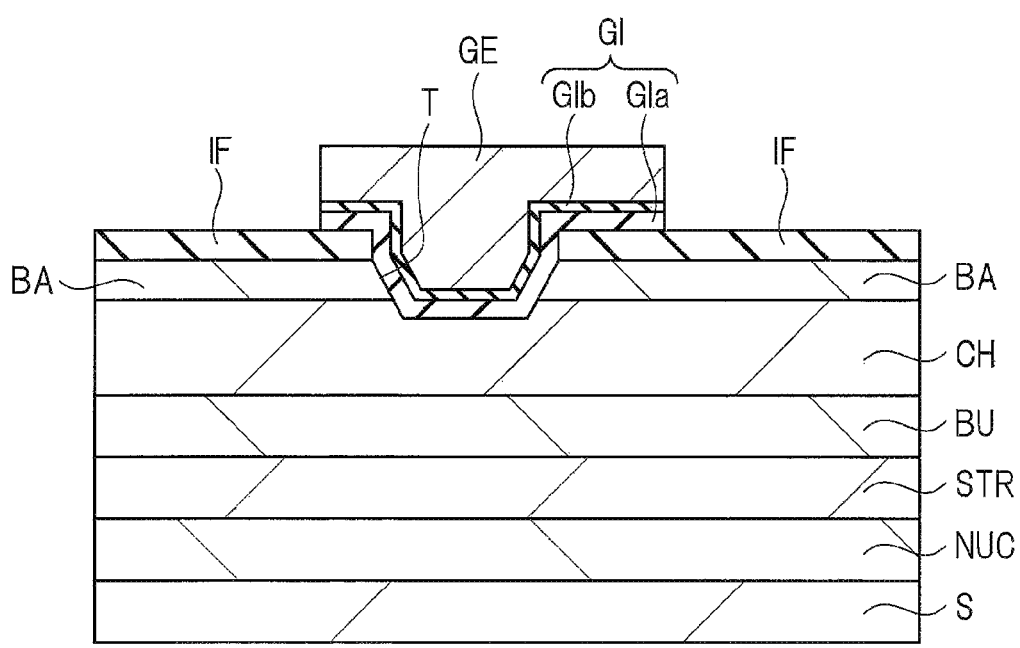
FIG. 21 is a cross-sectional view showing the manufacturing process of the semiconductor device of the third embodiment continued from FIG. 20.

Next, as shown in FIG. 20 and FIG. 21, the gate electrode GE is formed on the gate insulating film GI. For example, a titanium nitride (TiN) film is formed as a conductive film (GE) on the gate insulating film GI (FIG. 20). The titanium nitride film with a film thickness of about 100 nm is deposited by, for example, the reactive sputtering method using Ti metal target and mixed gas of argon (Ar) and nitrogen ($N_2$). The ALD method or the CVD method may be used for the formation of the gate electrode GE other than the PVD method. Next, the titanium nitride film is patterned by using the photolithography technique and the etching technique, thereby forming the gate electrode GE (FIG. 21). Note that the gate insulating film GI of the lower layer may be etched in the etching of the titanium nitride film. In addition, metal such as Ti, Ta, TaN, Au, Al, W, WN, Ir, Pt and Ru or metal compound thereof may be used as a material to form the gate electrode GE other than the TiN film. Also, a film obtained by laminating two or more kinds of these metals or metal compounds may be used.

Figure 22:
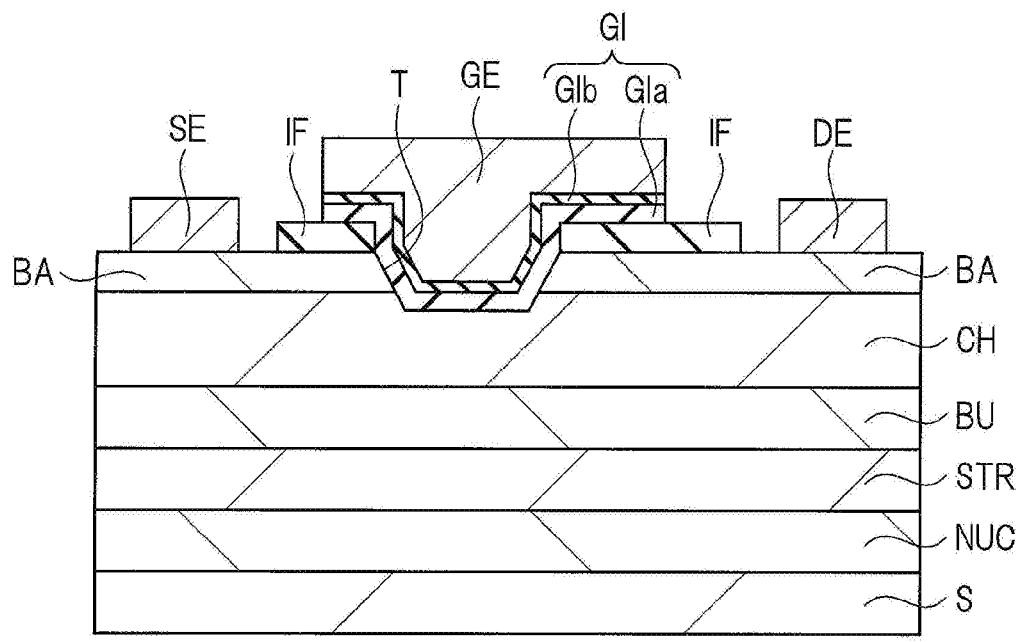
FIG. 22 is a cross-sectional view showing the manufacturing process of the semiconductor device of the third embodiment continued from FIG. 21.

Next, as shown in FIG. 22, the source electrode SE and the drain electrode DE are formed on the barrier layer BA on both sides of the gate electrode GE. For example, a laminated film (referred to also as Al/Ti film) of a titanium (Ti) film and an aluminum (Al) film formed thereon is deposited on the gate electrode GE and the barrier layer BA by the deposition method or the like. Then, a laminated film (referred to also as TiN/Ti film) of a titanium (Ti) film and a titanium nitride (TiN) film formed thereon is deposited on the Al/Ti film by the sputtering method or the like. Next, the TiN/Ti/Al/Ti film is patterned by using the photolithography technique and the etching technique, and the heat treatment is performed at 550° C. for about 30 minutes. This heat treatment forms the ohmic contact at the interface between the source and drain electrodes SE and DE (TiN/Ti/Al/Ti film) and the barrier layer BA (nitride semiconductor film).

Figure 23:
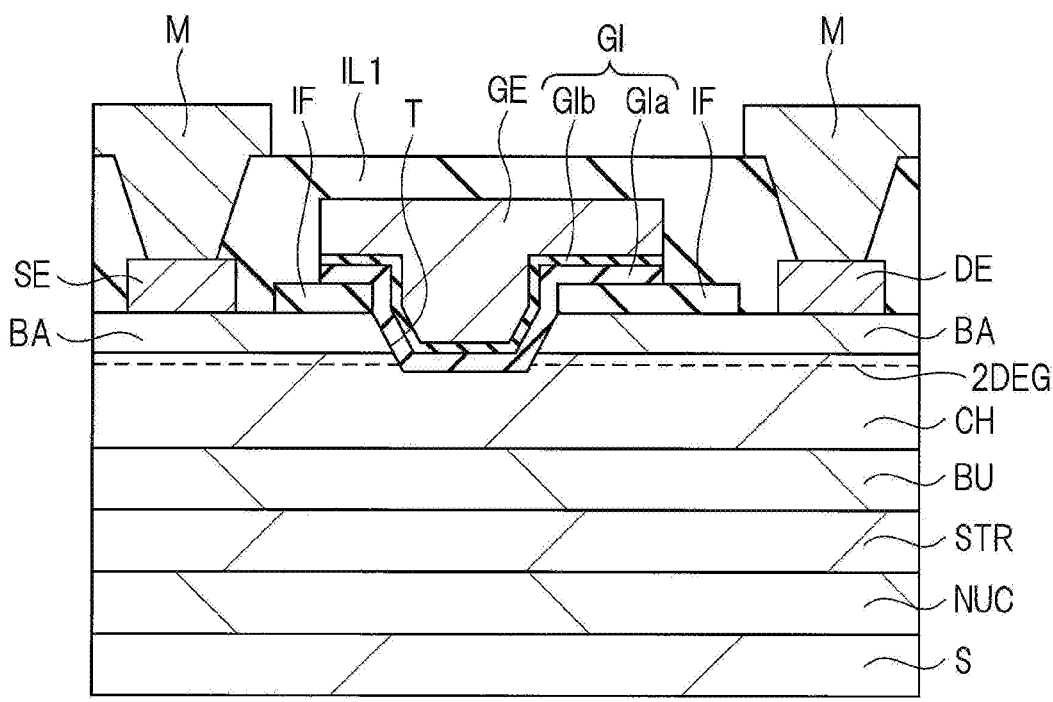
FIG. 23 is a cross-sectional view showing the manufacturing process of the semiconductor device of the third embodiment continued from FIG. 22.

Next, as shown in FIG. 23, for example, a silicon oxide film is formed as the insulating layer IL1 on the gate electrode GE, the source electrode SE and the drain electrode DE by the CVD method or the like. Next, the insulating layer IL1 on the source electrode SE and the drain electrode DE is removed by etching by the photolithography technique and the etching technique, thereby forming contact holes. A conductive film is formed on the insulating layer IL including the inside of the contact holes. For example, an aluminum alloy film is deposited by the sputtering method or the like. As the aluminum alloy, for example, alloy of Al and Si (Al—Si), alloy of Al and Cu (copper) (Al—Cu) and alloy of Al, Si and Cu (Al—Si—Cu) can be used. Next, the aluminum alloy film is patterned by using the photolithography technique and the etching technique, thereby forming the conductive films (plugs) in the contact holes and the wirings M formed thereon.

Thereafter, the insulating layer (referred to also as cover film or surface protection film) IL2 is formed on the insulating layer IL1 as well as on the source electrode SE and the drain electrode DE. As the insulating layer IL2, for example, a silicon oxynitride (SiON) film is deposited by the CVD method or the like (see FIG. 13).

Through the process described above, the semiconductor device of the present embodiment can be formed.

As described above, according to the present embodiment, the oxide film of the first metal and the oxide film of the second metal whose electronegativity is lower than that of the first metal are laminated and used as the gate insulating film, and thus the threshold voltage (Vth) can be shifted in the positive direction. Further, it is possible to achieve the normally-off characteristic in which the threshold voltage (Vth) is positive (Vth>0) by adjusting the shift amount.

In particular, even when the heat treatment to reduce the trap density in the oxide film is performed, the threshold voltage (Vth) which has been shifted in the negative direction can be returned in the positive direction.

Figure 24:
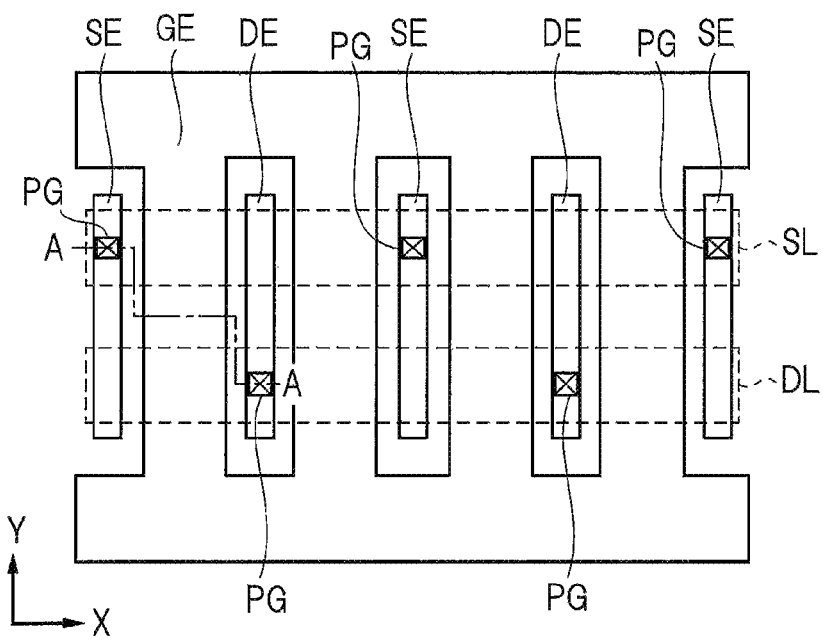
FIG. 24 is a plan view showing an example of the configuration of the semiconductor device of the third embodiment.

The layout of the gate electrode GE, the source electrode SE and the drain electrode DE described above is not limited, but these electrodes are arranged in the manner shown in FIG. 24, for example. FIG. 24 is a plan view showing an example of the configuration of the semiconductor device of the present embodiment. For example, FIG. 13 corresponds to an A-A cross section of FIG. 24. The source electrode SE and the drain electrode DE have, for example, a linear shape extending in the Y direction. In other words, the source electrode SE and the drain electrode DE have a rectangular shape (quadrangular shape) with a long side in the Y direction. The source electrode SE and the drain electrode DE are alternately arranged in the X direction. Then, the gate electrode GE is arranged between the source electrode SE and the drain electrode DE. For example, one ends (on an upper side of FIG. 24) of a plurality of gate electrode portions (GE) with a linear shape extending in the Y direction are connected to a line (referred to also as gate line) extending in the X direction. Also, the other ends (on a lower side of FIG. 24) of the plurality of gate electrode portions (GE) with a linear shape extending in the Y direction are connected to a line (referred to also as gate line) extending in the X direction. Note that the gate electrode GE may have a comb-like shape by eliminating either one of the two lines (referred to also as gate lines) extending in the X direction. Also, the plurality of source electrodes SE are connected to a source line SL extending in the X direction via plugs (connection portions) PG. In addition, the plurality of drain electrodes DE are connected to a drain line DL extending in the X direction via plugs (connection portions) PG. In FIG. 13, the source line SL and the drain line DL correspond to the wirings M.

Fourth Embodiment

In the third embodiment (FIG. 13), the oxide film of the first metal (for example, aluminum oxide film) is used as the film of the lower layer (GIa) of the gate insulating film GI. Meanwhile, in the present embodiment, Si (semiconductor) is used as an element constituting the film of the lower layer (GIa) of the gate insulating film GI.

[Description of Structure]

Figure 25:
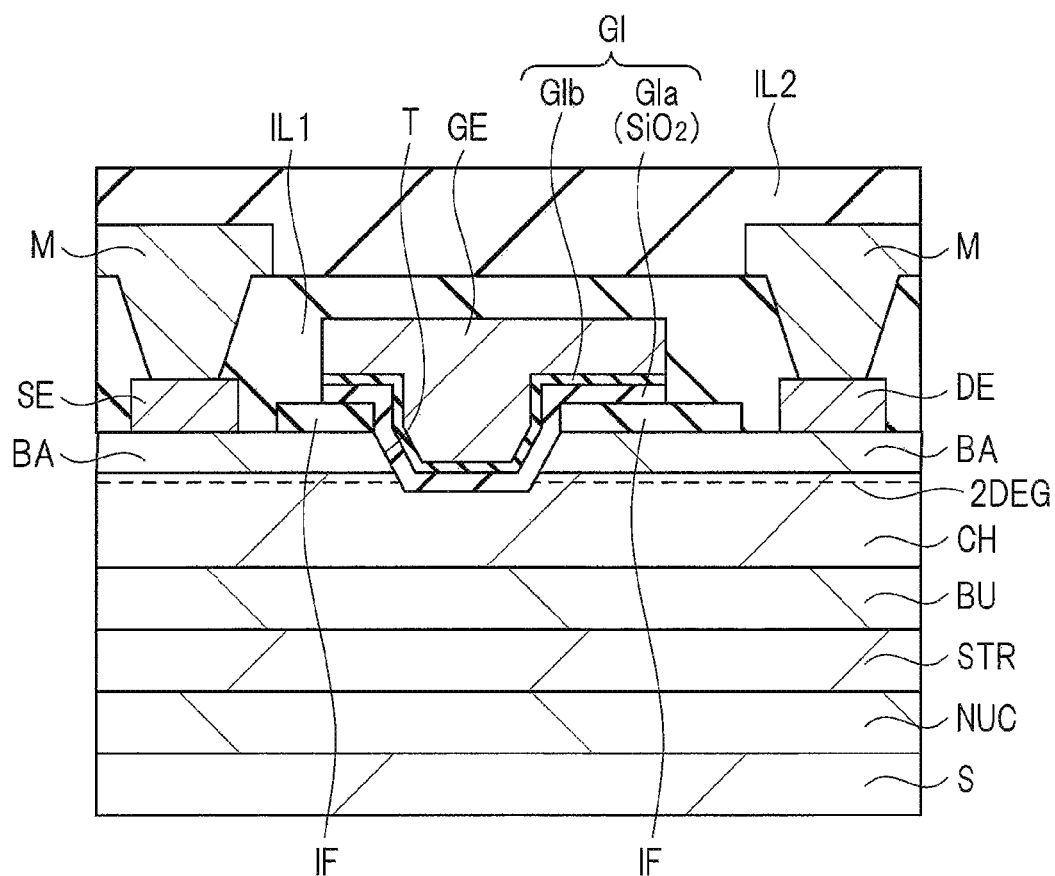
FIG. 25 is a cross-sectional view showing a configuration of a semiconductor device of a fourth embodiment.

FIG. 25 is a cross-sectional view showing a configuration of a semiconductor device of the present embodiment. As shown in FIG. 25, the semiconductor device of the present embodiment is a recessed gate high electron mobility transistor similar to that of the first embodiment. The semiconductor device of the present embodiment is the same as that of the third embodiment except that a silicon oxide film is formed as the first gate insulating film GIa instead of the oxide film of the first metal.

The semiconductor device of the present embodiment includes a plurality of nitride semiconductor layers formed on the substrate S like in the case of the third embodiment. Specifically, the nucleation layer NUC, the strain relief layer STR, the buffer layer BU, the channel layer (referred to also as electron transit layer) CH and the barrier layer BA are sequentially formed on the substrate S. The gate electrode GE is formed in the trench (referred to also as recess) T, which is formed to penetrate the insulating film IF and the barrier layer BA and reach the middle of the channel layer CH, with the gate insulating film GI interposed therebetween. Herein, the gate insulating film GI includes the first gate insulating film GIa formed on the channel layer CH and the second gate insulating film GIb formed on the first gate insulating film GIa. The first gate insulating film GIa is made of oxide of Si (semiconductor). The second gate insulating film GIb is made of the oxide of the second metal. Also, the electronegativity of the second metal is lower than the electronegativity of Si. In addition, the source electrode SE and the drain electrode DE are formed on the barrier layer BA on both sides of the gate electrode GE.

Also, the silicon oxide film serving as the first gate insulating film GIa is not the film formed by thermally oxidizing the channel layer (nitride semiconductor) CH, but is the film formed by a so-called deposition method. Namely, the oxide film of Si of the lower layer is not the oxide of the element constituting the nitride semiconductor layer. As described above, since the oxide film of Si is not the film formed by directly oxidizing the channel layer (nitride semiconductor), Si is different from the element constituting the channel layer (nitride semiconductor).

Also, the silicon oxide film serving as the first gate insulating film GIa is thicker than the second gate insulating film GIb. In other words, the film thickness of the silicon oxide film serving as the first gate insulating film GIa is larger than the film thickness of the second gate insulating film GIb.

For example, the film thickness of the first gate insulating film GIa (the silicon oxide film) is preferably 30 nm or more.

For example, the film thickness of the second gate insulating film GIb (the oxide film of the second metal) is preferably 1 nm or more and 10 nm or less and more preferably 3 nm or more and 5 nm or less.

The second metal is one or more elements selected from the group including Al, Hf, Zr, Ta, Ti, Nb, La, Y and Mg. In this case, the oxide of the second metal is, for example, aluminum oxide ($Al_2O_3$), hafnium oxide ($HfO_2$), zirconium oxide (ZrO), tantalum oxide ($Ta_2O_5$), titanium oxide ($TiO_2$), niobium oxide ($Nb_2O_5$), lanthanum oxide ($La_2O_3$) yttrium oxide ($Y_2O_3$) or magnesium oxide (MgO). The composition ratio between the second metal and oxygen is not limited to those described above. In addition, two or more kinds of elements may be contained as the second metal. In this case, the oxide of the second metal is the compound of two kinds of metal and oxygen. In this case, however, all of the two or more kinds of elements need to have electronegativity lower than that of Si. In addition, the oxide of the second metal does not contain Si or a metal element whose electronegativity is lower than that of Si. However, the oxide of the second metal may contain Si or a metal element whose electronegativity is lower than that of Si at a level of impurities (for example, metal of 0.01% or less).

As described above, in the present embodiment, oxides of Si and the second metal different in electronegativity are laminated and used as the gate insulating film GI and the oxide film of the second metal whose electronegativity is lower than that of Si is disposed as an upper layer, and it is thus possible to shift the threshold voltage (Vth) in a positive direction like in the case of the first embodiment.

Further, since a silicon oxide film ($SiO_2$) is used as the first gate insulating film GIa in the present embodiment, the effect of shifting the threshold voltage (Vth) in the positive direction is greater in comparison with the case of using aluminum oxide ($Al_2O_3$) described in the first embodiment. Namely, since the electronegativity of Si and Al has the relation of Al<Si (see table 1), when an oxide film of the same second metal (except for Al) is used as the second gate insulating film GIb, the electronegativity of Si, Al and the second metal has the relation of the second metal<Al<Si.

Therefore, the difference in electronegativity becomes larger in the combination of the second metal and Si than in the combination of the second metal and Al. The origin of the interfacial polarization described in the first embodiment is the difference in electronegativity, and the interfacial polarization quantity increases as the difference becomes larger. Therefore, when a silicon oxide film ($SiO_2$) is used as the first gate insulating film GIa of the lower layer, the effect of shifting the threshold voltage (Vth) in the positive direction is greater in comparison with the case of using aluminum oxide ($Al_2O_3$).

[Description of Manufacturing Method]

Next, a manufacturing method of the semiconductor device of the present embodiment will be described. The manufacturing method of the semiconductor device of the present embodiment is the same as that of the third embodiment except that a silicon oxide film is formed as the first gate insulating film GIa instead of the oxide film of the first metal.

Specifically, the nucleation layer NUC, the strain relief layer STR, the buffer layer BU, the channel layer CH and the barrier layer BA are sequentially formed on the substrate S in the same manner as the first embodiment. For example, materials similar to those of the third embodiment can be used as the constituent materials of these layers. In addition, these layers can be formed by the same processes as those of the third embodiment.

Also, the electron affinity of the channel layer CH is higher than the electron affinity of the buffer layer BU. In addition, the channel layer CH is nitride semiconductor whose bandgap is narrower than that of the buffer layer BU. Further, the electron affinity of the barrier layer BA is lower than the electron affinity of the channel layer CH. In addition, the barrier layer BA is nitride semiconductor whose bandgap is wider than that of the channel layer CH.

Next, the insulating film IF having an opening is formed on the barrier layer BA, and the barrier layer BA and the channel layer CH are etched with using the insulating film IF as a mask, thereby forming the trench T.

Next, the gate insulating film GI having the first gate insulating film GIa and the second gate insulating film GIb is formed in the trench T and on the insulating film IF. For example, the first gate insulating film GIa is formed in the trench T in which the channel layer CH is exposed at the bottom and on the insulating film IF. For example, a silicon oxide film ($SiO_2$ film) is deposited as the first gate insulating film GIa on a bottom surface and a side wall of the trench T and on the insulating film IF. Specifically, after a surface of the substrate S is cleaned with diluted HCl solution, a silicon oxide film ($SiO_2$ film) with a film thickness of about 50 nm is deposited in the trench T and on the insulating film IF by the ALD method using, for example, trisdimethylaminosilane ($SiH(N(CH_3)_2)_3$, TDMAS) and ozone ($O_3$, oxidizing agent) as source gas in an atmosphere at 480° C. The silicon oxide film may be deposited by the CVD method (thermal CVD method, plasma CVD method or the like) other than the ALD method. The ALD method has good controllability in film thickness and can form a film with good coatability even on an irregular surface.

Next, the heat treatment is performed. For example, the heat treatment is performed in nitrogen ($N_2$) atmosphere at 750° C. for about 1 minute. This heat treatment reduces the traps (defects) in the first gate insulating film GIa (here, silicon oxide film).

Next, a hafnium oxide film ($HfO_2$ film) is formed as the second gate insulating film GIb on the first gate insulating film GIa (here, silicon oxide film). The hafnium oxide film is deposited by, for example, the reactive sputtering method using Hf metal target and mixed gas of argon (Ar) and oxygen ($O_2$). A film thickness of the hafnium oxide film is preferably about 1 to 10 nm though it differs depending on the threshold potential (Vth). The reactive sputtering method is one type of the PVD methods. The ALD method or the CVD method may be used for the formation of the second gate insulating film GIb other than the PVD method.

Next, the heat treatment is performed. For example, the heat treatment is performed in nitrogen ($N_2$) atmosphere at 750° C. for about 1 minute. This heat treatment reduces the traps (defects) in the second gate insulating film GIb (here, hafnium oxide film). In the above-described process, the heat treatment after the formation of the first gate insulating film GIa (silicon oxide film) and the heat treatment after the formation of the second gate insulating film GIb (hafnium oxide film) are separately performed, but the heat treatment may be collectively performed after the formation of a laminated film of the first gate insulating film GIa (silicon oxide film) and the second gate insulating film GIb (hafnium oxide film) by omitting the heat treatment after the formation of the first gate insulating film GIa (silicon oxide film).

In this manner, the gate insulating film GI having the laminated film of the first gate insulating film GIa (silicon oxide film) and the second gate insulating film GIb (hafnium oxide film) is formed.

Next, the gate electrode GE, the source electrode SE and the drain electrode DE are formed in the same manner as the case of the third embodiment, and the insulating layer IL1, the plug, the wiring M and the insulating layer IL2 are further formed (see FIG. 25).

Through the process described above, the semiconductor device of the present embodiment can be formed.

As described above, according to the present embodiment, the oxide film of Si and the oxide film of the second metal whose electronegativity is lower than that of Si are laminated and used as the gate insulating film, and thus the threshold voltage (Vth) can be shifted in the positive direction. Further, it is possible to achieve the normally-off characteristic in which the threshold voltage (Vth) is positive (Vth>0) by adjusting the shift amount.

In particular, even when the heat treatment to reduce the trap density in the oxide film is performed, the threshold voltage (Vth) which has been shifted in the negative direction can be returned in the positive direction.

In the foregoing, the invention made by the inventors of the present invention has been concretely described based on the embodiments. However, it is needless to say that the present invention is not limited to the foregoing embodiments and various modifications and alterations can be made within the scope of the present invention.

APPENDIX 1

A semiconductor device including:
a first nitride semiconductor layer formed over a substrate;
a second nitride semiconductor layer formed on the first nitride semiconductor layer;
a third nitride semiconductor layer formed on the second nitride semiconductor layer;
a trench penetrating the third nitride semiconductor layer to reach the second nitride semiconductor layer; and
a gate electrode disposed in the trench with a gate insulating film interposed therebetween,
wherein an electron affinity of the third nitride semiconductor layer is lower than an electron affinity of the second nitride semiconductor layer,
the electron affinity of the second nitride semiconductor layer is higher than an electron affinity of the first nitride semiconductor layer,
the gate insulating film includes an oxide film of Si formed on a bottom surface and a side wall of the trench and an oxide film of metal having electronegativity lower than that of the Si and formed on the oxide film of Si, and
the Si is different from an element constituting the second nitride semiconductor layer.

APPENDIX 2

The semiconductor device described in the appendix 1, wherein the oxide film of Si is a laminated film.

APPENDIX 3

The semiconductor device described in the appendix 2, wherein the laminated film is formed by an atomic layer deposition method.

APPENDIX 4

The semiconductor device described in the appendix 1, wherein the second metal is one or more elements selected from a group including Al, Hf, Zr, Ta, Ti, Nb, La, Y and Mg.

APPENDIX 5

The semiconductor device described in the appendix 4, wherein the second nitride semiconductor layer is GaN.

APPENDIX 6

The semiconductor device described in the appendix 1, wherein the oxide film of Si is thicker than the oxide film of the metal having electronegativity lower than that of the Si.

APPENDIX 7

The semiconductor device described in the appendix 1, wherein the oxide film of Si is thicker than the oxide film of the metal having electronegativity lower than that of the Si, and
a film thickness of the oxide film of the metal having electronegativity lower than that of the Si is 1 nm or more and 10 nm or less.

APPENDIX 8

A manufacturing method of a semiconductor device including the steps of:
(a) forming an oxide film of first metal on a nitride semiconductor layer;
(b) forming an oxide film of second metal having electronegativity lower than that of the first metal on the oxide film of the first metal; and (c) forming a gate electrode on the oxide film of the second metal,
wherein the step (a) is a step of depositing the oxide film of the first metal on the nitride semiconductor layer, and
a step of performing a heat treatment to the oxide film of the first metal is carried out after the step (a).

APPENDIX 9

The manufacturing method of a semiconductor device described in the appendix 8,
wherein the step (a) is a step of depositing the oxide film of the first metal by an atomic layer deposition method.

APPENDIX 10

The manufacturing method of a semiconductor device described in the appendix 8,
wherein the first metal is Al.

APPENDIX 11

The manufacturing method of a semiconductor device described in the appendix 10,
wherein the second metal is one or more elements selected from a group including Hf, Zr, Ta, Ti, Nb, La, Y and Mg.

APPENDIX 12

The manufacturing method of a semiconductor device described in the appendix 11,
wherein the nitride semiconductor layer is GaN.

APPENDIX 13

The manufacturing method of a semiconductor device described in the appendix 8,
wherein the oxide film of the first metal is thicker than the oxide film of the second metal.

APPENDIX 14

The manufacturing method of a semiconductor device described in the appendix 8,
wherein the oxide film of the first metal is thicker than the oxide film of the second metal, and
a film thickness of the oxide film of the second metal is 1 nm or more and 10 nm or less.

APPENDIX 15

A manufacturing method of a semiconductor device including the steps of:
(a) forming an oxide film of Si on a nitride semiconductor layer;
(b) forming an oxide film of metal having electronegativity lower than that of the Si on the oxide film of Si; and
(c) forming a gate electrode on the oxide film of the metal having electronegativity lower than that of the Si,
wherein the step (a) is a step of depositing the oxide film of Si on the nitride semiconductor layer, and
a step of performing a heat treatment to the oxide film of Si is carried out after the step (a).

APPENDIX 16

A manufacturing method of a semiconductor device including the steps of:

(a) forming a first nitride semiconductor layer over a substrate, forming a second nitride semiconductor layer with an electron affinity higher than that of the first nitride semiconductor layer on the first nitride semiconductor layer, and forming a third nitride semiconductor layer with an electron affinity lower than that of the second nitride semiconductor layer on the second nitride semiconductor layer;
(b) etching the third nitride semiconductor layer and the second nitride semiconductor layer, thereby forming a trench which penetrates the third nitride semiconductor layer to reach a middle of the second nitride semiconductor layer;
(c) forming an oxide film of first metal on a bottom surface and a side wall of the trench;
(d) forming an oxide film of second metal having electronegativity lower than that of the first metal on the oxide film of the first metal; and
(e) forming a gate electrode on the oxide film of the second metal,
wherein the step (c) is a step of depositing the oxide film of the first metal on the bottom surface and the side wall of the trench, and
a step of performing a heat treatment to the oxide film of the first metal is carried out after the step (c).

APPENDIX 17

A manufacturing method of a semiconductor device including the steps of:
(a) forming a first nitride semiconductor layer over a substrate, forming a second nitride semiconductor layer with an electron affinity higher than that of the first nitride semiconductor layer on the first nitride semiconductor layer, and forming a third nitride semiconductor layer with an electron affinity lower than that of the second nitride semiconductor layer on the second nitride semiconductor layer;
(b) etching the third nitride semiconductor layer and the second nitride semiconductor layer, thereby forming a trench which penetrates the third nitride semiconductor layer to reach a middle of the second nitride semiconductor layer;
(c) forming an oxide film of Si on a bottom surface and a side wall of the trench;
(d) forming an oxide film of metal having electronegativity lower than that of the Si on the oxide film of Si; and
(e) forming a gate electrode on the oxide film of the metal,
wherein the step (c) is a step of depositing the oxide film of Si on the bottom surface and the side wall of the trench, and
a step of performing a heat treatment to the oxide film of Si is carried out after the step (c).

REFERENCE SIGNS LIST

2DEG two-dimensional electron gas
BA barrier layer
BU buffer layer
C channel
CH channel layer
DE drain electrode
DR drain region
GE gate electrode
GI gate insulating film
GIa first gate insulating film
GIb second gate insulating film
IF insulating film
IL1 insulating layer
IL2 insulating layer
M wiring M1 first metal
M1O oxide film
M2 second metal
M2O oxide film
NUC nucleation layer
Ox oxide film
SE source electrode
SR source region
STR strain relief layer
T trench

The invention claimed is:

1. A semiconductor device comprising:
a first nitride semiconductor layer formed on top of a substrate;
a second nitride semiconductor layer formed on top of the first nitride semiconductor layer;
a third nitride semiconductor layer formed on the second nitride semiconductor layer;
a trench penetrating the third nitride semiconductor layer to reach the second nitride semiconductor layer; and
a gate electrode disposed in the trench with a gate insulating film interposed therebetween,
wherein an electron affinity of the third nitride semiconductor layer is lower than an electron affinity of the second nitride semiconductor layer,
the electron affinity of the second nitride semiconductor layer is higher than an electron affinity of the first nitride semiconductor layer,
the gate insulating film is made of aluminum oxide formed on a bottom surface and a side wall of the trench and hafnium oxide formed on the aluminum oxide,
the second nitride semiconductor layer is GaN,
the aluminum oxide is thicker than the hafnium oxide,
a film thickness of the hafnium oxide is 3 nm or larger and 10 nm or smaller, and
a threshold potential is positive.

2. The semiconductor device according to claim 1,
wherein the gate insulating film comprises a laminated film that is formed by an atomic layer deposition method.

3. The semiconductor device according to claim 1,
wherein the film thickness of the hafnium oxide is 3 nm or larger and 5 nm or smaller.

4. The semiconductor device according to claim 1, wherein:
the first nitride semiconductor layer is formed over on top of the substrate,
the second nitride semiconductor layer is formed on top of the first nitride semiconductor layer, and
the third nitride semiconductor layer is formed on top of the second nitride semiconductor layer.

5. The semiconductor device according to claim 1,
wherein the trench penetrates through the third nitride semiconductor layer and into a portion of the second nitride semiconductor layer,
wherein the aluminum oxide is formed on the bottom surface of the trench penetrating into the portion of the second nitride semiconductor.

6. The semiconductor device according to claim 1,
wherein the second nitride is a channel layer, and the third nitride is a barrier layer,
wherein the first nitride is formed directly on top of the substrate,
wherein the second nitride semiconductor layer is formed directly on top of the first nitride semiconductor layer.

7. A semiconductor device comprising:
a plurality of nitride semiconductor layers formed on top of a substrate, the plurality of nitride semiconductor layers includes at least first nitride, second nitride and third nitride semiconductor layers, the second nitride semiconductor layer formed on top of the first nitride semiconductor layer;
a trench penetrating the third nitride semiconductor layer to reach the second nitride semiconductor layer; and
a gate electrode disposed in the trench with a gate insulating film interposed therebetween the trench and the gate electrode,
wherein an electron affinity of the third nitride semiconductor layer is lower than an electron affinity of the second nitride semiconductor layer,
the electron affinity of the second nitride semiconductor layer is higher than an electron affinity of the first nitride semiconductor layer,
the gate insulating film is made of aluminum oxide formed on a bottom surface and a side wall of the trench and hafnium oxide formed on the aluminum oxide,
the second nitride semiconductor layer is GaN,
the aluminum oxide is thicker than the hafnium oxide,
a film thickness of the hafnium oxide is 3 nm or larger and 10 nm or smaller, and
a threshold potential is positive.

8. The semiconductor device according to claim 7,
wherein the gate insulating film comprises a laminated film that is formed by an atomic layer deposition method.

9. The semiconductor device according to claim 7,
wherein the film thickness of the hafnium oxide is 3 nm or larger and 5 nm or smaller.

10. The semiconductor device according to claim 7,
wherein the first nitride, second nitride and third nitride semiconductor layers being stacked on top of each other,
wherein the trench penetrates the third nitride semiconductor layer to reach a middle of the second nitride semiconductor layer, and
wherein the aluminum oxide is formed on the bottom surface of the trench penetrating into the middle of the second nitride semiconductor.

* * * * *